US012641811B2

(12) United States Patent
Chen et al.

(10) Patent No.: US 12,641,811 B2
(45) Date of Patent: May 26, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Li-Hui Chen, Hsinchu County (TW); Chun-Hung Chen, Hsinchu (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 859 days.

(21) Appl. No.: 17/880,341

(22) Filed: Aug. 3, 2022

(65) Prior Publication Data

US 2024/0047560 A1     Feb. 8, 2024

(51) Int. Cl.
| | |
|---|---|
| *H10D 30/01* | (2025.01) |
| *H10B 10/00* | (2023.01) |
| *H10D 30/62* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC .......... *H10D 30/024* (2025.01); *H10B 10/12* (2023.02); *H10D 30/6211* (2025.01); *H10D 62/151* (2025.01); *H10D 64/021* (2025.01); *H10D 84/017* (2025.01); *H10D 84/0184* (2025.01); *H10D 84/0193* (2025.01); *H10D 84/038* (2025.01); *H10D 84/853* (2025.01)

(58) Field of Classification Search
CPC ............ H10D 84/017; H10D 84/0184; H10D 64/017; H10D 84/013; H10D 30/797; H10D 84/0128; H10D 84/0158; H10D 84/834
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |

(Continued)

*Primary Examiner* — Fernando L Toledo
*Assistant Examiner* — Adam S Bowen
(74) *Attorney, Agent, or Firm* — Birch, Stewart, Kolasch & Birch, LLP

(57) ABSTRACT

A method of forming a semiconductor device includes forming first and second fin structures on a substrate, forming first and second gate stacks crossing the first and second fin structures, respectively, wherein the first fin structure has a first channel region under the first gate stack and a first source/drain region adjacent to the first channel region, and the second fin structure has a second channel region under the second gate stack and a second source/drain region adjacent to the second channel region, performing an ion implantation process to introduce impurities into the second source/drain region to form an implanted region in the second source/drain region, performing an etching process to form first and second recesses in the first and second source/drain regions, respectively, wherein the second recess penetrates through the implanted region, and forming epitaxy structures in the first and second recesses, respectively.

20 Claims, 21 Drawing Sheets

(56)        References Cited

U.S. PATENT DOCUMENTS

|  |  |  |  |  |
|---|---|---|---|---|
| 9,245,805 | B2 | 1/2016 | Yeh et al. | |
| 9,418,897 | B1 | 8/2016 | Ching et al. | |
| 9,520,482 | B1 | 12/2016 | Chang et al. | |
| 9,576,814 | B2 | 2/2017 | Wu et al. | |
| 9,608,116 | B2 | 3/2017 | Ching et al. | |
| 9,812,363 | B1 | 11/2017 | Liao et al. | |
| 9,859,380 | B2 | 1/2018 | Lee et al. | |
| 10,170,555 | B1 * | 1/2019 | Liao | H10D 84/0193 |
| 2018/0277536 | A1 * | 9/2018 | Wu | H10D 84/038 |
| 2020/0091146 | A1 * | 3/2020 | Tsao | H10D 62/83 |
| 2021/0313441 | A1 * | 10/2021 | Lin | H01L 21/02356 |

* cited by examiner

SEMICONDUCTOR DEVICE AND MANUFACTURING METHOD THEREOF

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' on a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials, and strained source drain (SSD) has been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
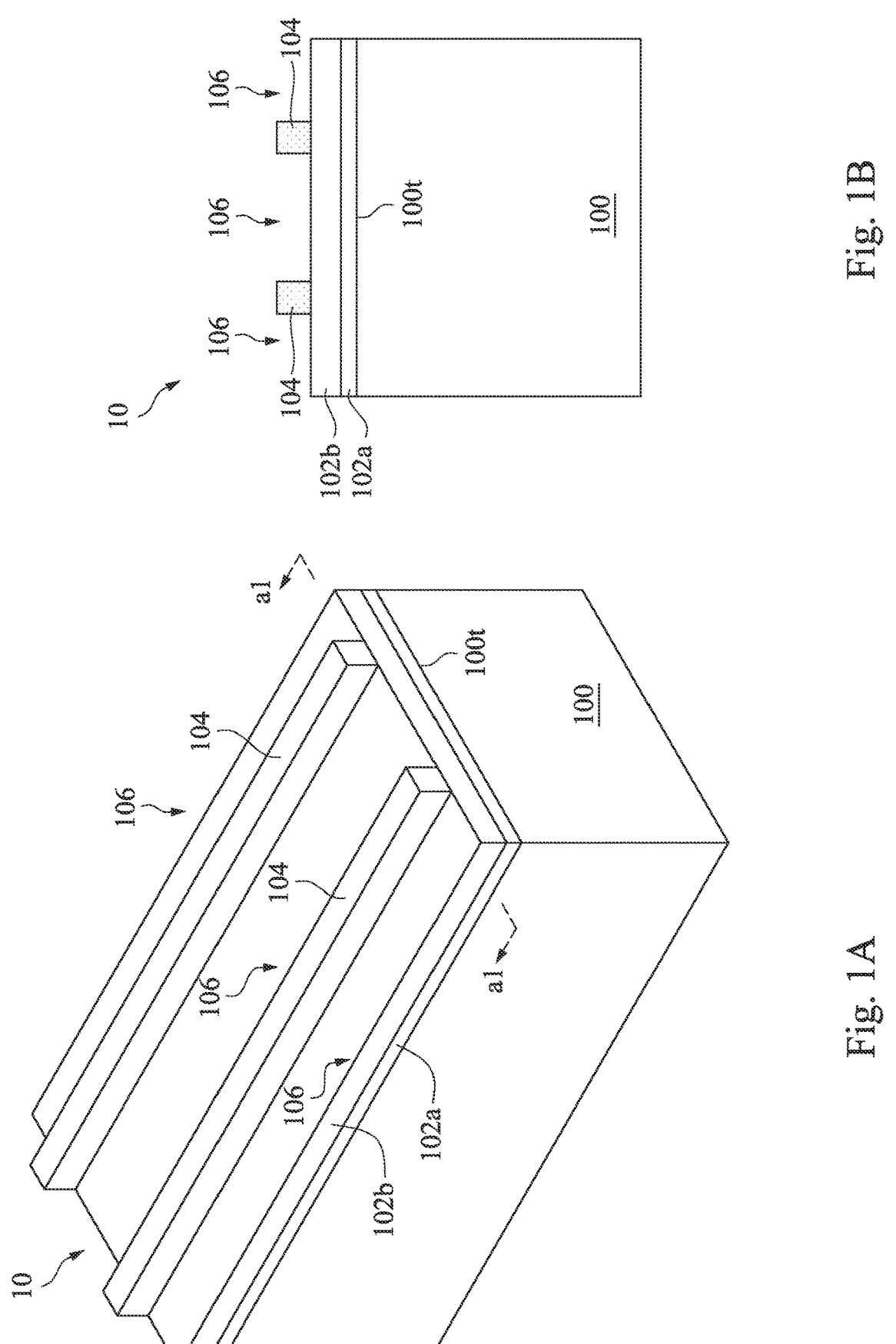
FIGS. 1A, 2A, 3A and 4A are perspective views of a semiconductor device at various stages of fabrication according to various embodiments of the present disclosure.
FIGS. 1B, 2B, 3B and 4B are cross-sectional views of a semiconductor device taken along the line a1-a1 of FIGS. 1A, 2A, 3A and 4A, respectively.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A, 2A, 3A, and 4A are perspective views of a semiconductor device 10 at various stages of fabrication according to various embodiments of the present disclosure. As employed in the present disclosure, the term semiconductor device 10 refers to a fin field effect transistor (FinFET). The semiconductor device 10 refers to any fin-based, or multi-gate transistor. Other transistor structures and analogous structures are within the contemplated scope of the disclosure. The semiconductor device 10 may be included in a microprocessor, memory cell, and/or other integrated circuit (IC).

FIGS. 1A through 18 are simplified for a better understanding of the concepts of the present disclosure. For example, although the figures illustrate the semiconductor device 10, it is understood the IC may comprise a number of other devices comprising resistors, capacitors, inductors, fuses, etc.

Referring to FIGS. 1A and 1B, a substrate 100 on which an isolation structure surrounding the fins 108 will be formed, is provided. FIG. 1A is a perspective view of the semiconductor device 10 having a substrate 100 at one of the various stages of fabrication according to an embodiment, and FIG. 1B is a cross-sectional view of semiconductor device 10 taken along the line a1-a1 of FIG. 1A.

In one embodiment, the substrate 100 includes a semiconductor substrate (e.g., Si, SiGe, or SiGeB). In alternative embodiments, the substrate 100 includes a silicon-on-insulator (SOI) structure. The substrate 100 may include various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In one embodiment, a pad layer 102a and a mask layer 102b are formed on a top surface 100t of the substrate 100. The pad layer 102a may be a thin film including silicon oxide formed, for example, using a thermal oxidation process. The pad layer 102a may act as an adhesion layer between the substrate 100 and mask layer 102b. The pad layer 102a may also act as an etch stop layer for etching the mask layer 102b. In an embodiment, the mask layer 102b is formed of silicon nitride, for example, using low-pressure chemical vapor deposition (LPCVD) or plasma enhanced chemical vapor deposition (PECVD). The mask layer 102b is used as a hard mask during subsequent photolithography processes. A photoresist 104 is formed on the mask layer 102b and is then patterned, forming openings 106 in the photoresist 104.

Figure 2B:
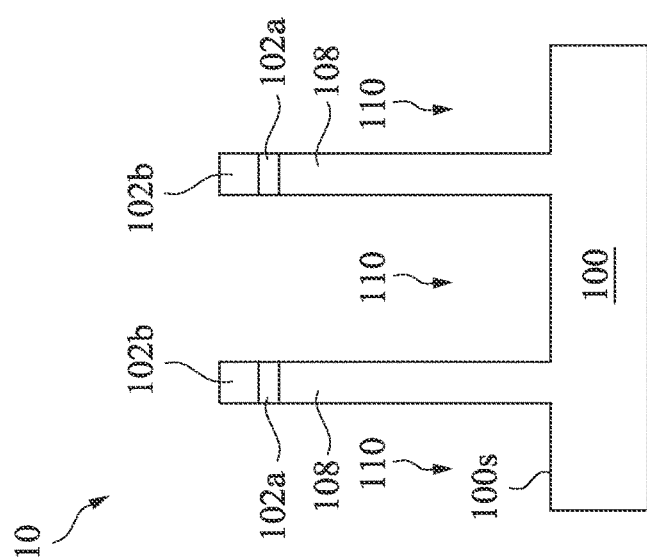
Figure 2A:
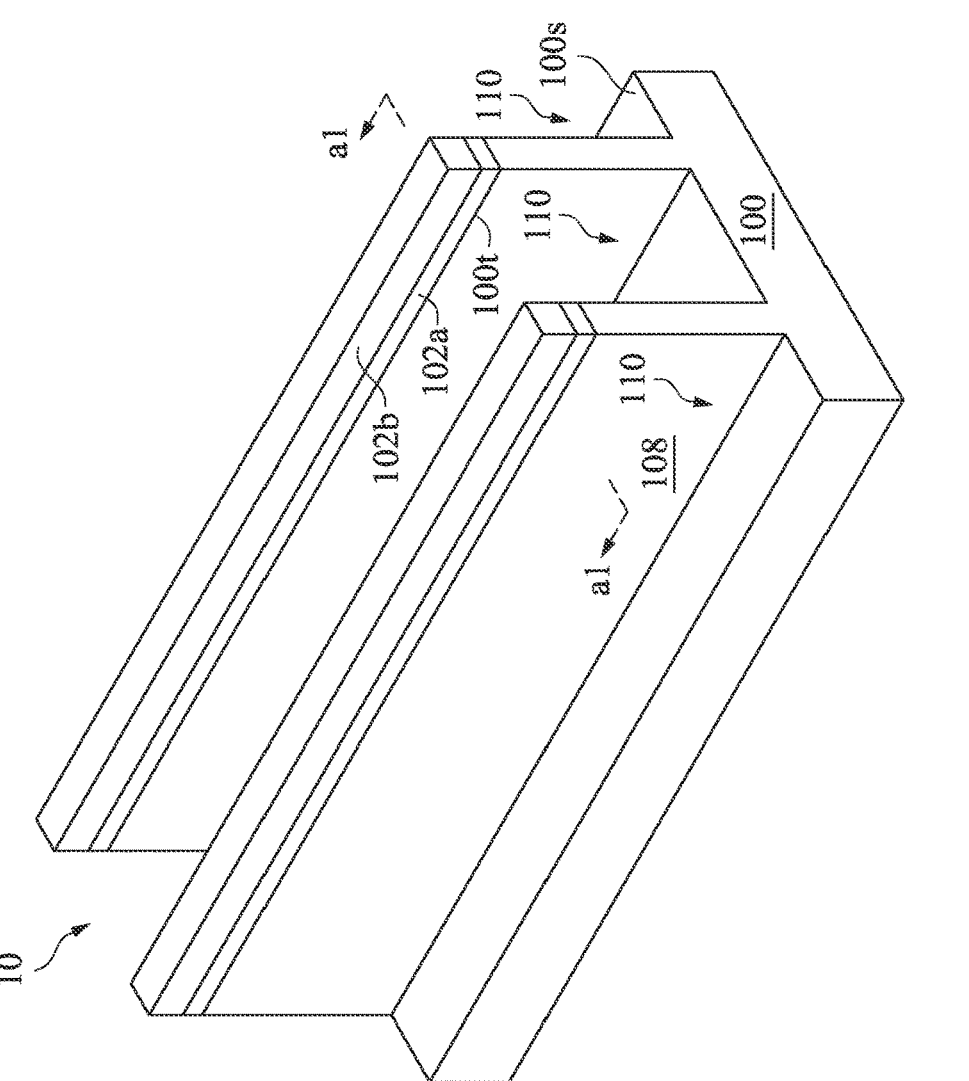

Referring to FIGS. 2A and 2B, after formation of the openings 106 in the photoresist 104, the substrate 100 is etched, forming fins 108 protruding from the substrate 100. FIG. 2A is a perspective view of the semiconductor device 10 at one of the various stages of fabrication according to an embodiment, and FIG. 2B is a cross-sectional view of semiconductor device 10 taken along the line a1-a1 of FIG. 2A.

The mask layer 102b and the pad layer 102a are etched through the openings 106 to expose underlying substrate 100. The exposed substrate 100 is then etched to form trenches 110 with a major surface 100s of the substrate 100. Portions of the substrate 100 between trenches 110 form the fins 108 protruding from the major surface 100s of the substrate 100. In some embodiments, the trenches 110 may be strips (viewed from in the top of the semiconductor device 10) parallel to each other, and closely spaced with respect to each other. In some embodiments, the trenches 110 may be continuous and surrounding the fins 108.

As an example for illustration, the fins 108 protruding from the major surface 100s include two fins. Other numbers of fins 108 are within the contemplated scope of the present disclosure. The photoresist 104 is then removed. Next, a cleaning may be performed to remove a native oxide of the substrate 100. The cleaning may be performed using diluted hydrofluoric (DHF) acid.

Figures 3A, 3B:
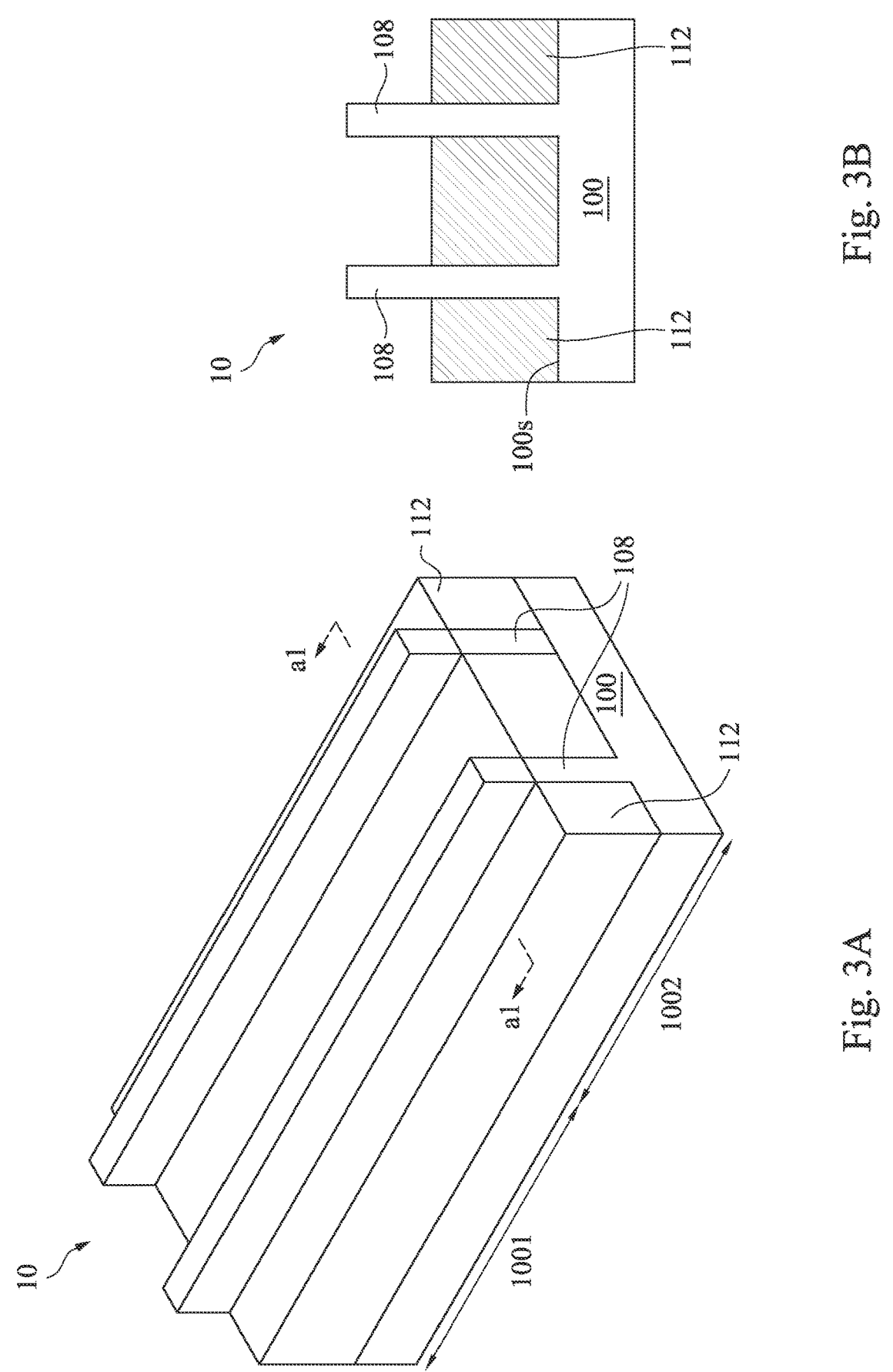

In FIGS. 3A and 3B, shallow trench isolation (STI) regions 112 are formed adjacent the fins 108. The STI regions 112 may be formed by depositing an insulation material over the substrate 100 and between adjacent fins 108. The insulation material may be an oxide, such as silicon oxide, a nitride, the like, or a combination thereof, and may be formed by high-density plasma chemical vapor deposition (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the fins 108. Although the insulation material is illustrated as a single layer, some embodiments may utilize multiple layers. For example, in some embodiments a liner (not separately illustrated) may first be formed along a surface of the substrate 100 and the fins 108. Thereafter, a fill material, such as those discussed above may be formed over the liner.

A removal process is then applied to the insulation material to remove excess insulation material over the fins 108. In some embodiments, a planarization process such as a chemical mechanical polish (CMP), an etch-back process, combinations thereof, or the like may be utilized. The planarization process exposes the fins 108 such that top surfaces of the fins 108 and the insulation material are level after the planarization process is complete.

The insulation material is then recessed to form the STI regions 112. The insulation material is recessed such that upper portions of fins 108 protrude from between neighboring STI regions 112. Further, the top surfaces of the STI regions 112 may have a flat surface as illustrated, a convex surface, a concave surface (such as dishing), or a combination thereof. The top surfaces of the STI regions 112 may be formed flat, convex, and/or concave by an appropriate etch. The STI regions 112 may be recessed using an acceptable etching process, such as one that is selective to the material of the insulation material (e.g., etches the material of the insulation material at a faster rate than the material of the fins 108). For example, an oxide removal using, for example, dilute hydrofluoric (dHF) acid may be used.

Figure 4A:
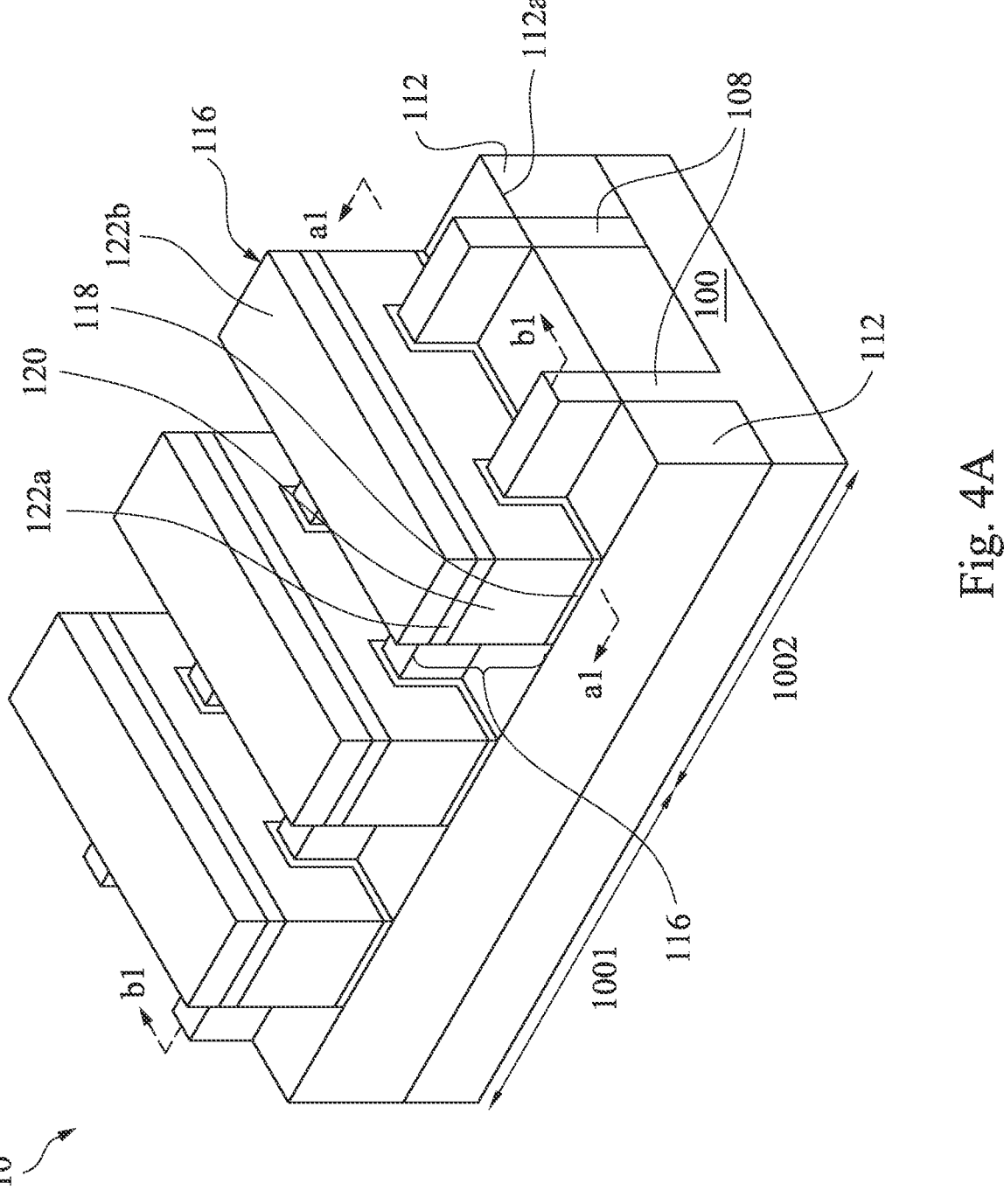
Figure 4B:
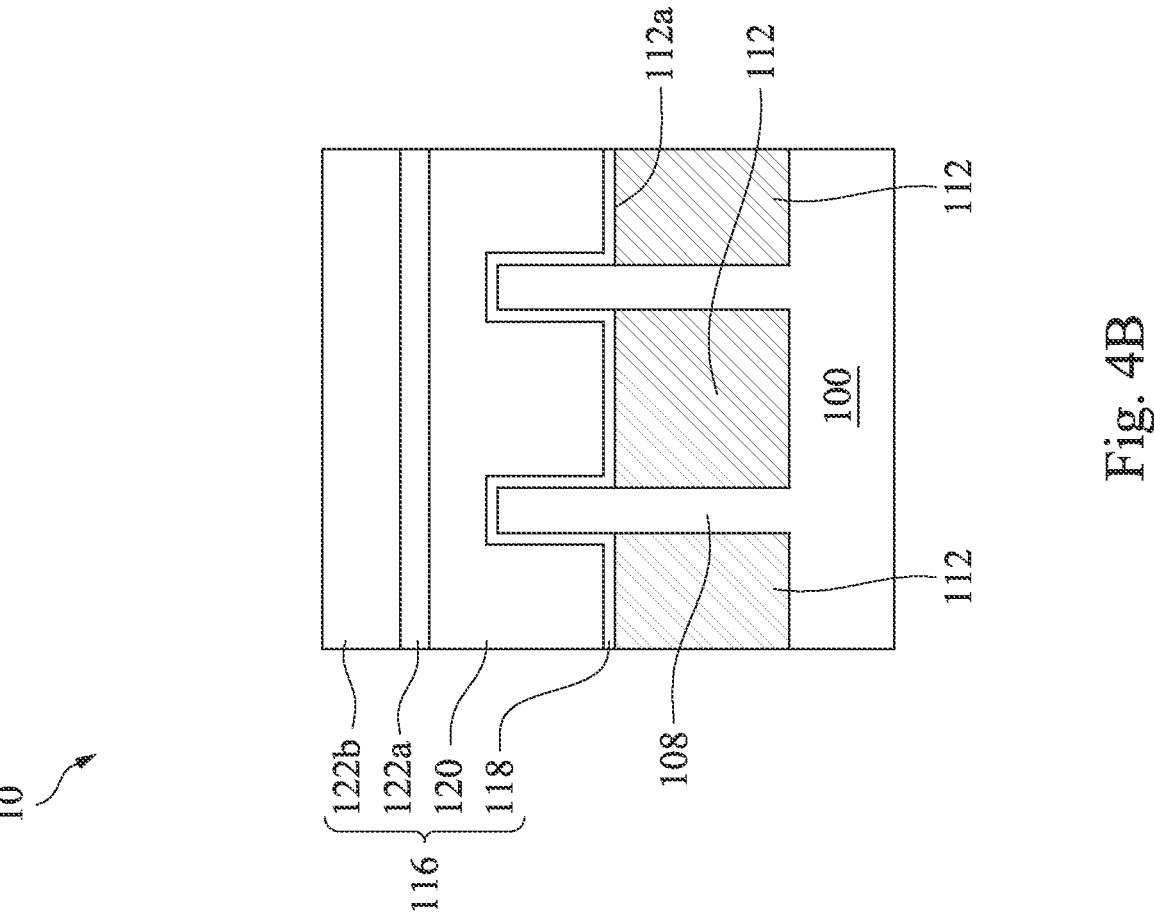
Figure 4C:
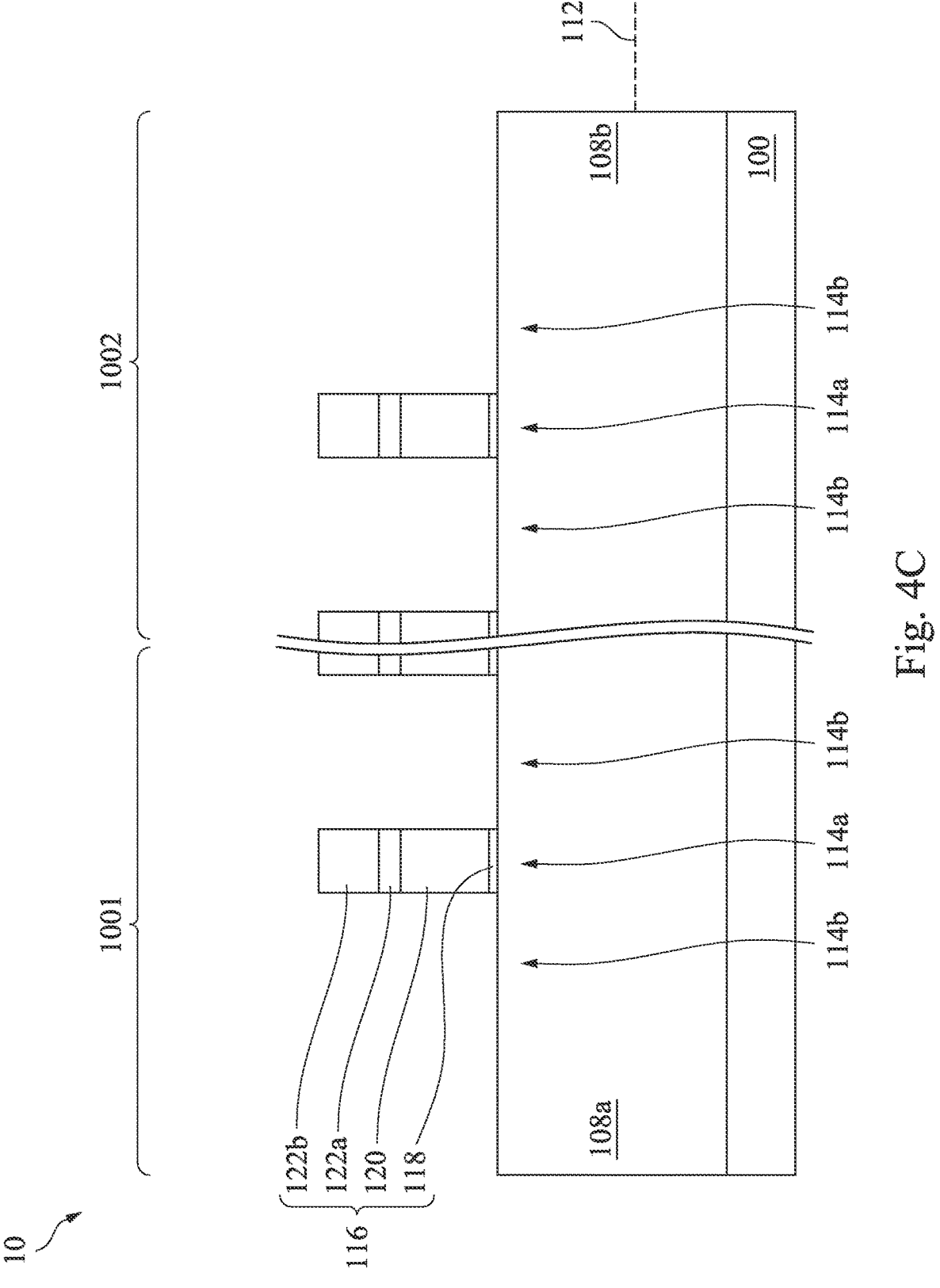
FIG. 4C is a cross-sectional view of semiconductor device taken along the line b1-b1 of FIG. 4A.

FIG. 4A is a perspective view of the semiconductor device 10 at one of the various stages of fabrication according to an embodiment. FIG. 4B is a cross-sectional view of the semiconductor device 10 taken along the line a1-a1 of FIG. 4A. FIG. 4C is a cross-sectional view of the semiconductor device 10 taken along the line b1-b1 of FIG. 4A. The device 10 has a first device region 1001 and a second device region 1002. The first device region 1001 is a region in which first transistors, such as static random access memory (SRAM) transistors will reside. The second device region 1002 is a region where second transistors, such as logic transistors will reside. In FIGS. 4C, 5 through 18, the level of top surfaces 112a of the STI regions 112 are illustrated, and the protruding fins 108 are over the level of the top surfaces 112a. The fin 108 in the first device region 1001 can be referred to as a first fin structure 108a. The fin 108 in the second device region 1002 can be referred to a second fin structure 108b.

Dummy gate stacks 116 are formed on the top surfaces and sidewalls of (protruding) fins 108. Portion of the fins 108 directly underlying the dummy gate stacks 116 may be referred to as the channel regions 114a. The dummy gate stack 116 may also define source/drain regions 114b of the fins 108, for example, as the regions of the respective semiconductor fins adjacent to and on opposing sides of the channel regions 114a of the fins 108. In other words, the source/drain regions 114b are on opposite sides of the dummy gate stacks 116. It is appreciated that although three dummy gate stack 116 are illustrated for clarity, there may be a plurality of dummy gate stacks formed, which are parallel to each other, with the plurality of dummy gate stacks crossing the same fin(s) 108. The dummy gate stack 116 may include a dummy gate dielectric 118 and a dummy gate electrode 120 over the dummy gate dielectric 118. The dummy gate electrode 120 may be formed, for example, using polysilicon, and other materials may also be used. The dummy gate electrode 120 may be made of other materials that have a high etching selectivity from the etching of STI regions 112. The dummy gate stack 116 may also include hard mask layers 122a and 122b over the dummy gate electrode 120. The hard mask layers 122a and 122b may be formed of silicon nitride and silicon oxide, respectively. The dummy gate stack 116 may cross over a single one or a plurality of protruding fins 108 and/or STI regions 112. The dummy gate stack 116 also has a lengthwise direction perpendicular to the lengthwise directions of protruding fins 108.

The dummy gate dielectric 118 may be, for example, silicon oxide, silicon nitride, a combination thereof, or the like, and may be deposited or thermally grown according to acceptable techniques. The dummy gate electrode 120 may be deposited over the dummy gate dielectric 118 and then planarized, such as by a CMP. The dummy gate electrode 120 may be deposited PVD, CVD, sputter deposition, or other techniques for depositing the selected material.

The dummy gate dielectric 118 may further include an interfacial layer (not shown) to reduce damage between the dummy gate dielectric 118 and channel regions 114a of the fins 108. The interfacial layer may include silicon oxide.

Figure 5:
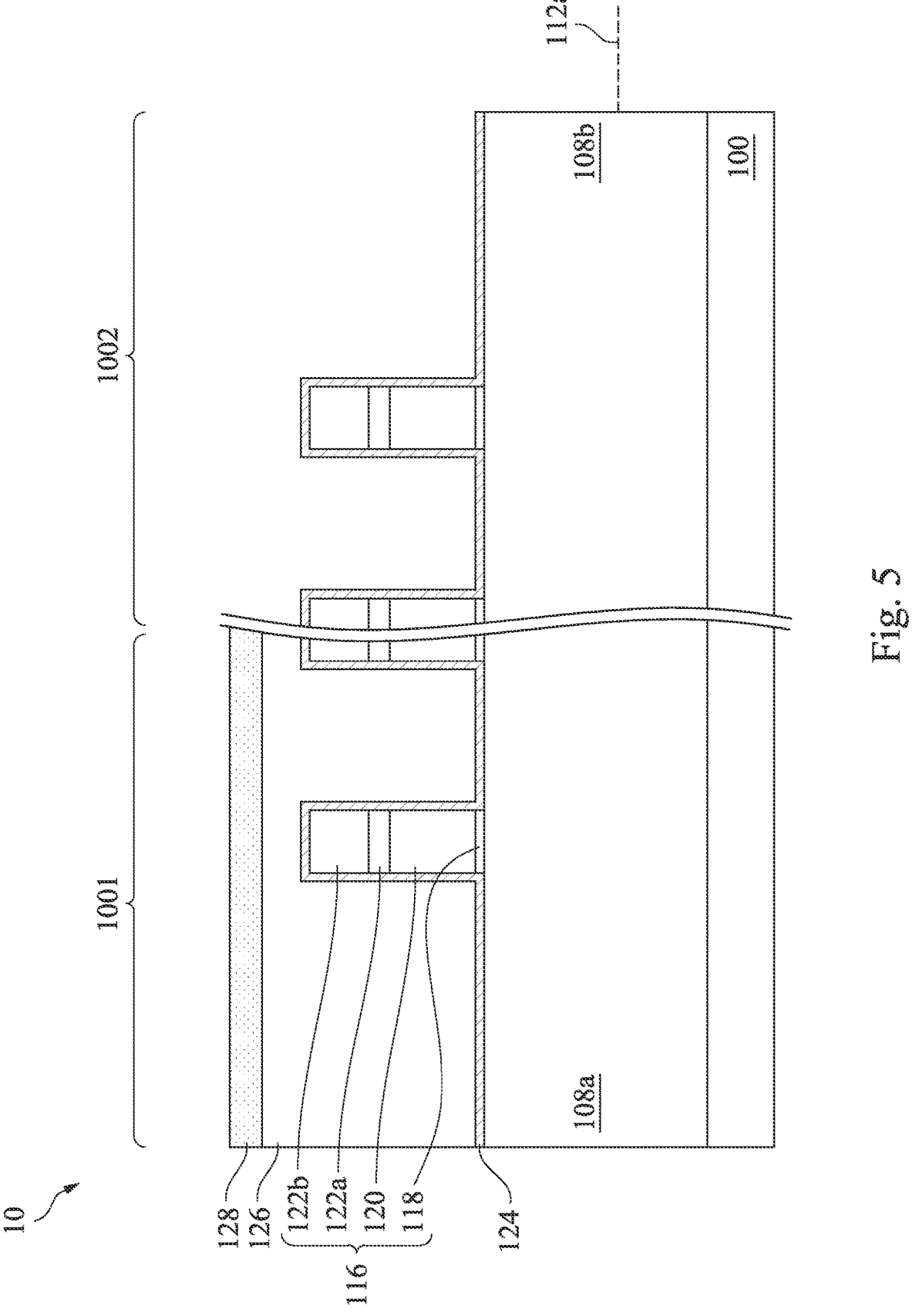
FIGS. 5-18 are cross-sectional views of a semiconductor device at various stages of fabrication according to various embodiments of the present disclosure.

A first spacer layer 124 is formed on the dummy gate stacks 116 and the fins 108. The first spacer layer 124 will be subsequently patterned to act as a first portion of multi-layer spacers for forming self-aligned source/drain regions. The first spacer layer 124 may be formed of silicon oxide, silicon nitride, silicon oxynitride, or the like, using techniques such as thermal oxidation or deposited by CVD, atomic layer deposition (ALD), or the like. In this case, the first spacer layer 124 is formed of SiOCN, and having a k value of 4.8 to 5.2, such as 5. A mask layer 126 is then formed on the first spacer layer 124. The mask layer 126 may then be used protect regions of the fins 108 while an implantation process forms an implanted region in the fins 108. The mask layer 126 includes silicon oxide, silicon nitride, silicon oxynitride, silicon carbide, other suitable dielectric material, or combinations thereof. The mask layer 126 may have a multi-layer structure. A photoresist 128 is formed on the mask layer 126 and is then patterned, forming openings in the photoresist 128. The mask layer 126 is then etched through the opening in the photoresist 128 to expose the underlying first spacer layer 124. The resulting structure is shown in FIG. 5.

Figure 6:
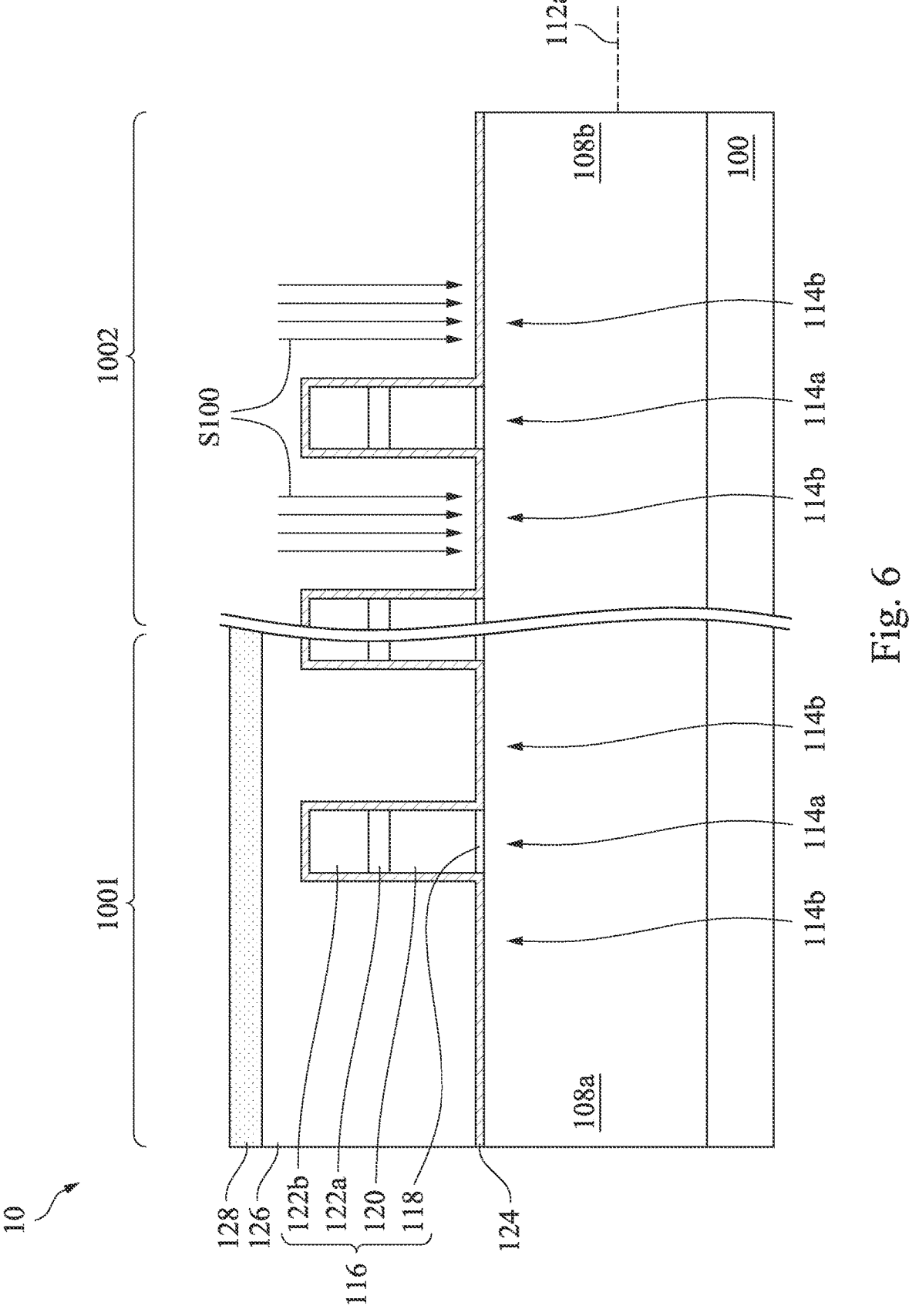
Figure 7:
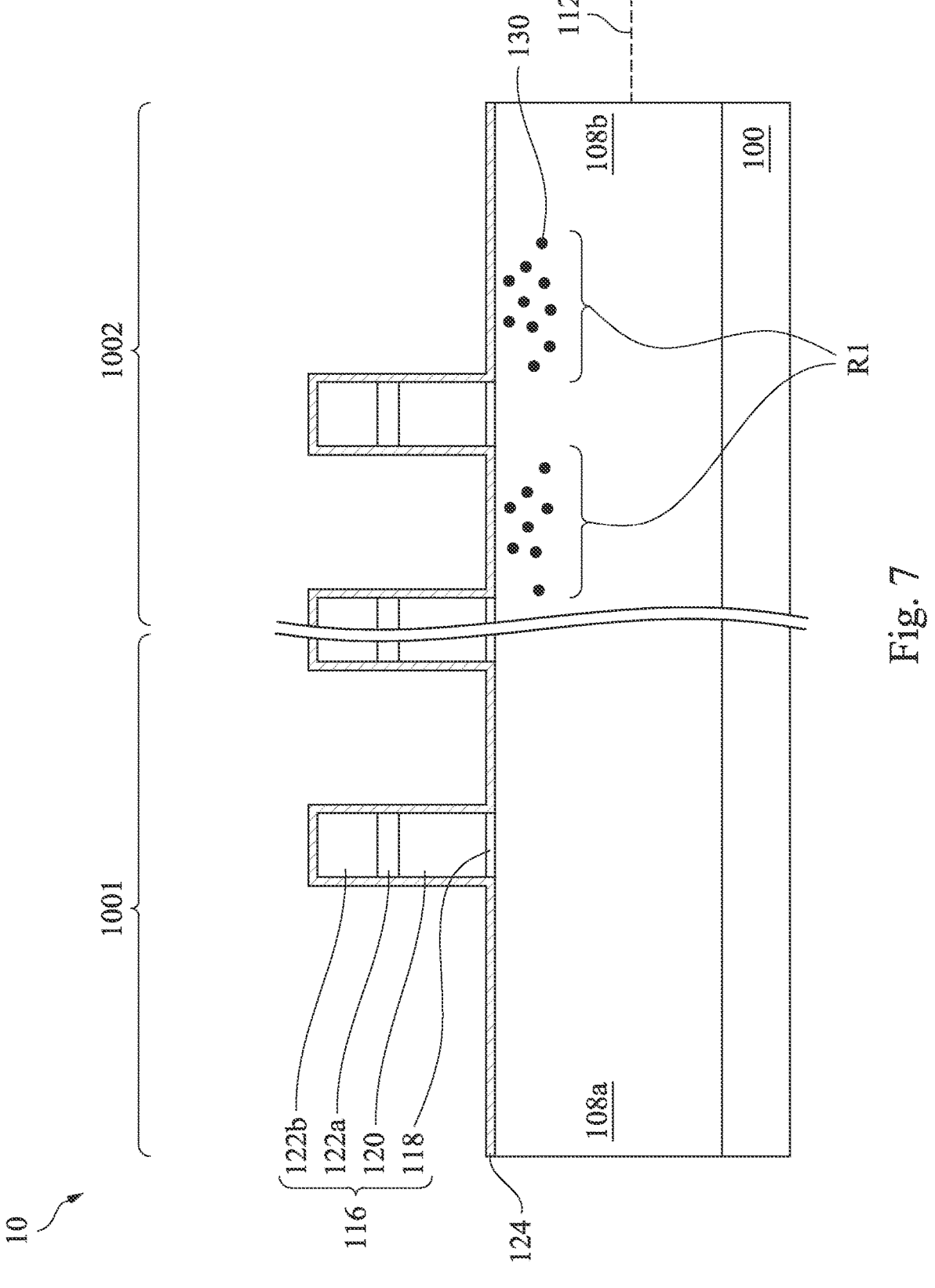

Next, in FIG. 6, an ion implantation process S100 is performed to introduce impurities (e.g., impurities 130 in FIG. 7) such as nitrogen atoms into the source/drain regions 114b of the fins 108. In some embodiments, the ion implantation process S100 is performed to introduce the impurities into an upper portion of the fins 108 without introducing the impurities into a lower portion of the fins 108. Therefore, the implanted region R1 is formed, as shown in FIG. 7. The implanted region R1 includes the impurities 130. The ion implantation process S100 is performed using the dummy gate stacks 116 as mask. The impurities 130 are neither n-type dopants nor p-type dopants, for example. The implantation process S100 utilizes any suitable doping species, and in the present example, utilizes nitrogen (N) doping species. The implantation process S100 includes any suitable implantation dose and/or energy. For example, the ion implantation process S100 may be performed at an energy level equals to about 3K eV. If the energy level is lower than about 3K eV, a mechanical structure of the implanted region R1 may not be weak enough. If the energy level is higher than about 3K eV, the mechanical structure of the implanted region R1 may be too weak such that a subsequent recess may be too deep during etching. The dopant concentration of the impurities 130 is about 1.0E15 atoms/cm$^3$ in some embodiments. The implanted regions R1 have a weakened mechanical strength due to the ion implantation process S100. That is, the implantation process S100 is configured to reduce an etch resistance of the fins 108 in the second device region 1002 exposed by the dummy gate stacks 116 (e.g., the source/drain regions 114b), allowing formation of recesses with depths that varied among the first device region 1001 and the second device region 1002 in later processing. Therefore, subsequent epitaxial source/drain regions that will be formed in the recesses for the first and second device regions 1001 and 1002 will have varied depths accordingly.

After the implantation process S100, the mask layer 126 is removed by using suitable etching process(es). The photoresist 128 is then removed, such as by an ashing process. The resulting structure is shown in FIG. 7.

Figure 8:
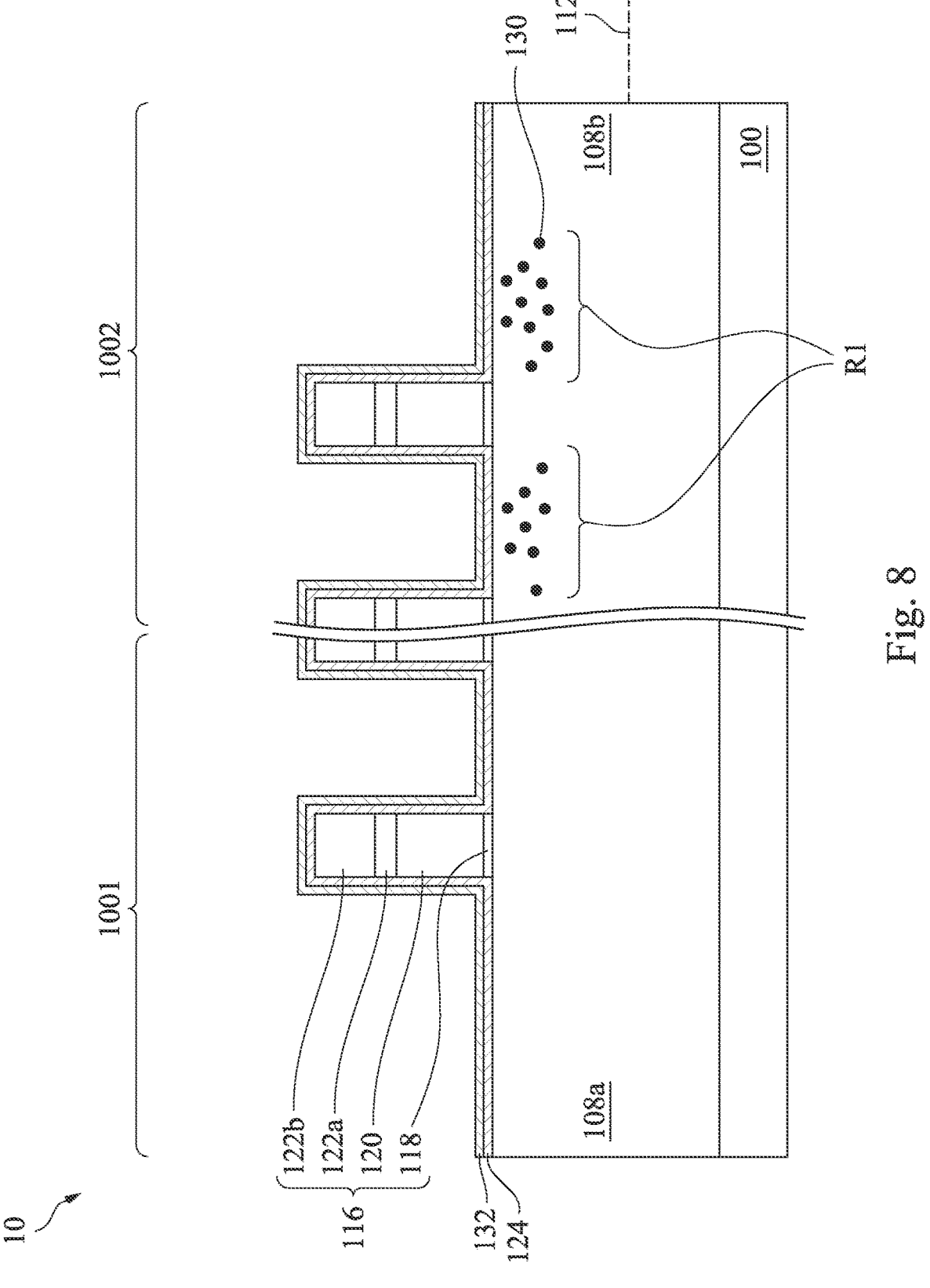

Reference is made to FIG. 8. A second spacer layer 132 is formed on the first spacer layer 124. The second spacer layer 132 will be subsequently patterned to act as a second portion of multi-layer spacers for forming self-aligned source/drain regions. The second spacer layer 132 may be formed of silicon oxide, silicon nitride, silicon oxynitride, or the like, using techniques such as thermal oxidation or deposited by CVD, ALD, or the like. In this case, the second spacer layer 132 is formed of SiOCN, and having a k value of 4.3 to 4.5, such as 4.4. The first spacer layer 124 and the second spacer layer 132 each have a controlled nitrogen concentration and a controlled oxygen concentration in order to tune the k values thereof. In some embodiments where the first spacer layer 124 and the second spacer layer 132 include SiOCN, the first spacer layer 124 has a nitrogen concentration greater than a nitrogen concentration of the second spacer layer 132, and the first spacer layer 124 has an oxygen concentration lower than an oxygen concentration of the second spacer layer 132 such that the second spacer layer 132 has a k value lower than a k value of the first spacer layer 124.

Figure 9:
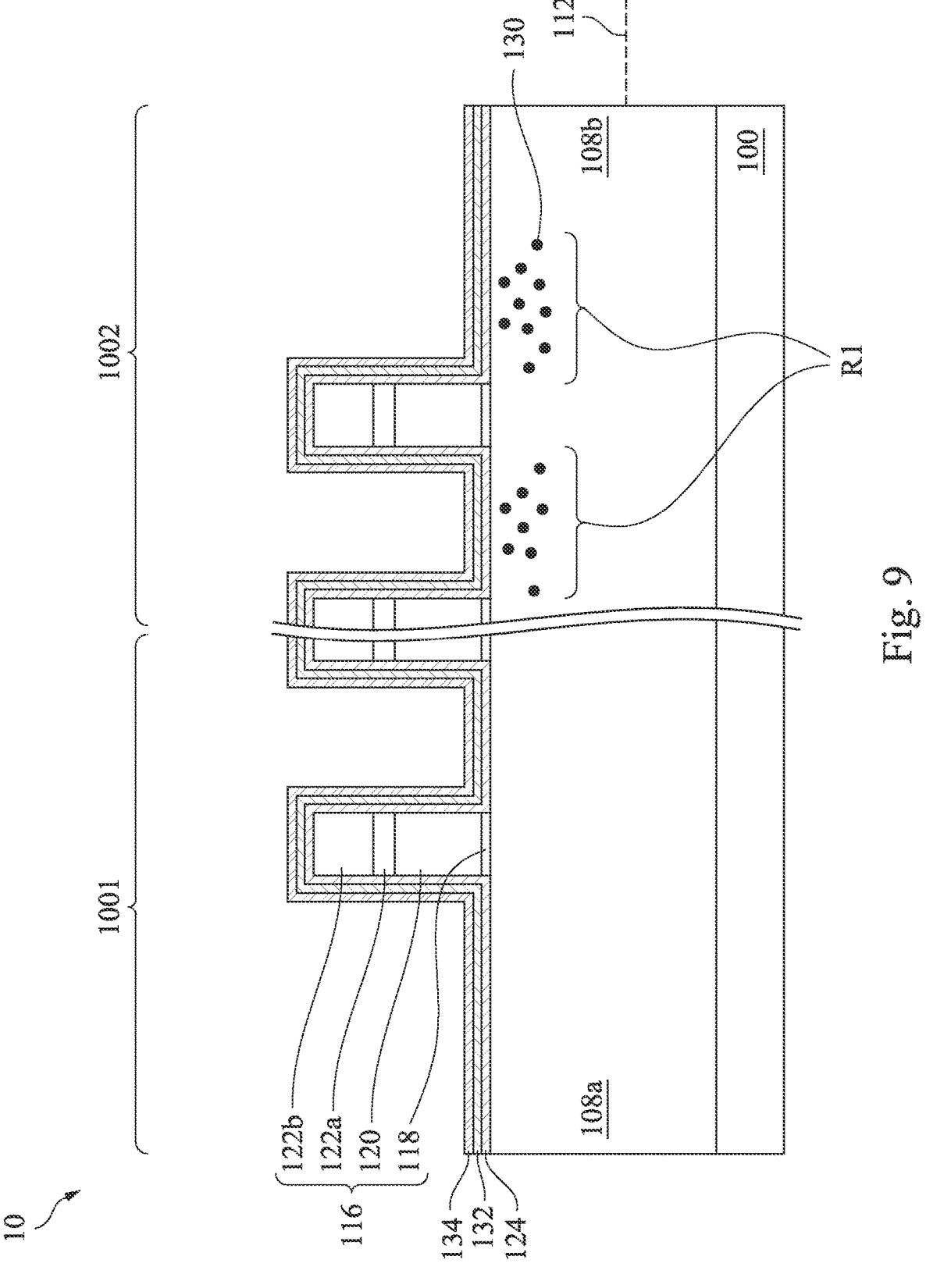

In FIG. 9, a third spacer layer 134 is formed on the second spacer layer 132. The third spacer layer 134 will be subsequently patterned to act as a third portion of multi-layer spacers for forming self-aligned source/drain regions. The third spacer layer 134 has a composition different from compositions of the second spacer layer 132 and the first spacer layer 124. The third spacer layer 134 may be formed of silicon oxide, silicon nitride, silicon oxynitride, or the like, using techniques such as thermal oxidation or deposited by CVD, ALD, or the like. In this case, the third spacer layer 134 includes SiN.

Figure 10:
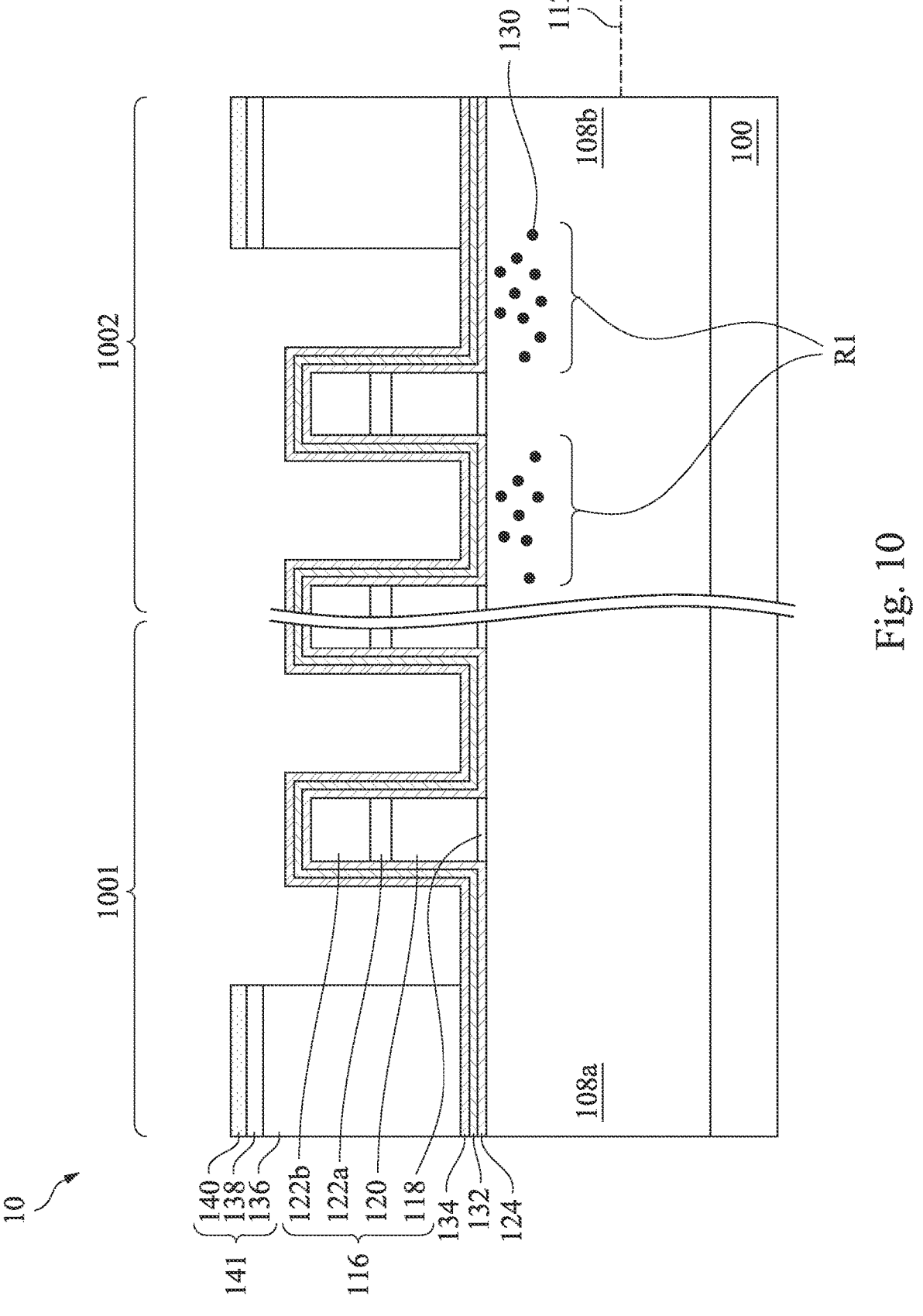

Next, a hard mask layer 136, a bottom anti-reflectance coating (BARC) layer 138, and a photoresist 140 are formed on the third spacer layer 134 in sequence. The hard mask layer 136, the BARC layer 138 and the photoresist 140 may then be used protect regions of the fins 108 while an etch process forms recesses in the fins 108. For example, the BARC layer 152 includes silicon oxynitride (e.g., SiON) and is formed to reduce undesired light reflections from an underlying layer (e.g., the hard mask layer 136) surface during a photolithographic patterning process. The photoresist 140 may be formed by spin-on coating and then patterned to form an opening. In some embodiments, the hard mask layer 136, the BARC layer 138 and the photoresist 140 are collectively referred to as a tri-layer mask 141, wherein the hard mask layer 136 is also called a bottom layer (BL) of the tri-layer mask, the BARC layer 138 is also called a middle layer (ML) of the tri-layer mask, and the photoresist 140 is also called a top layer of the tri-layer mask. The BARC layer 138 and the hard mask layer 136 are then etched through the opening in the photoresist 140 to expose the underlying third spacer layer 134. The resulting structure is shown in FIG. 10.

Figure 11:
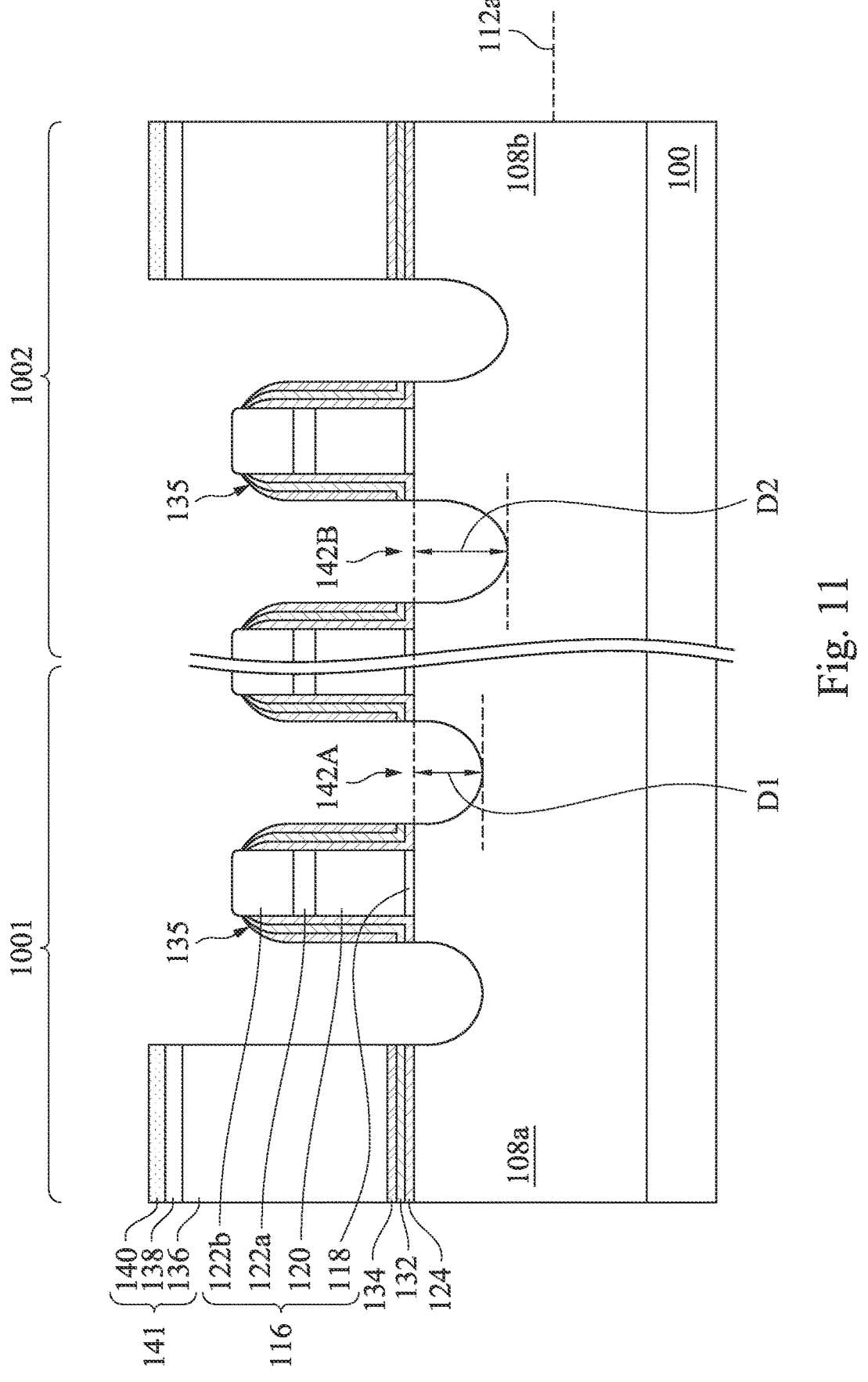

In FIG. 11, an etching process is performed to etch portions of the fins 108 exposed both by the tri-layer mask 141 are partially removed (or partially recessed) to form one or more first recesses 142A and one or more second recesses 142B in the fins 108 in the first device region 1001 and the second device region 1002, respectively. In some embodiments, the etch process may be performed by a dry, anisotropic etch. In FIG. 11, the implanted regions R1 (see FIG. 10) of the fins 108 have a relatively weak mechanical strength due to the ion implantation process S100 as discussed previously with regard to FIGS. 6 and 7, thereby resulting in the second recesses 142B having a depth D2 greater than a depth D1 of the first recesses 142A. After the etching process, the first spacer layer 124, the second spacer layer 132 and the third spacer layer 134 remain on and in contact with the sidewall of the dummy gate stacks 116 collectively refers to as gate spacers 135. The gate spacers 135 each can be referred to as a multi-layer gate spacer. The gate spacers 135 laterally surround the dummy gate stacks 116.

Figure 12:
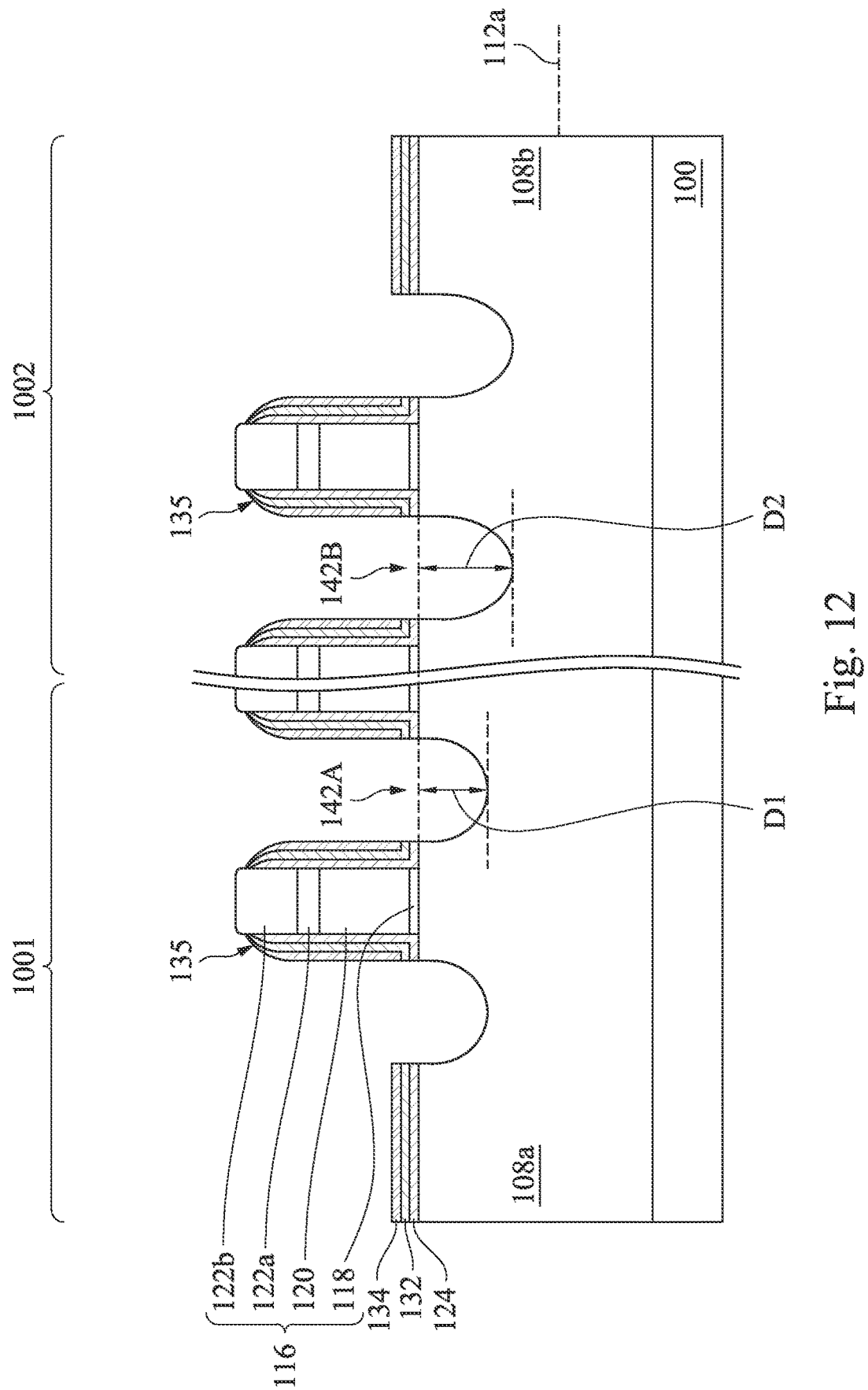

After forming the first recess 142A and the second recess 142B, the photoresist 140 is removed, such as by an ashing process. The hard mask layer 136 and the BARC layer 138 are then removed, and the resulting structure is shown in FIG. 12.

Figure 13:
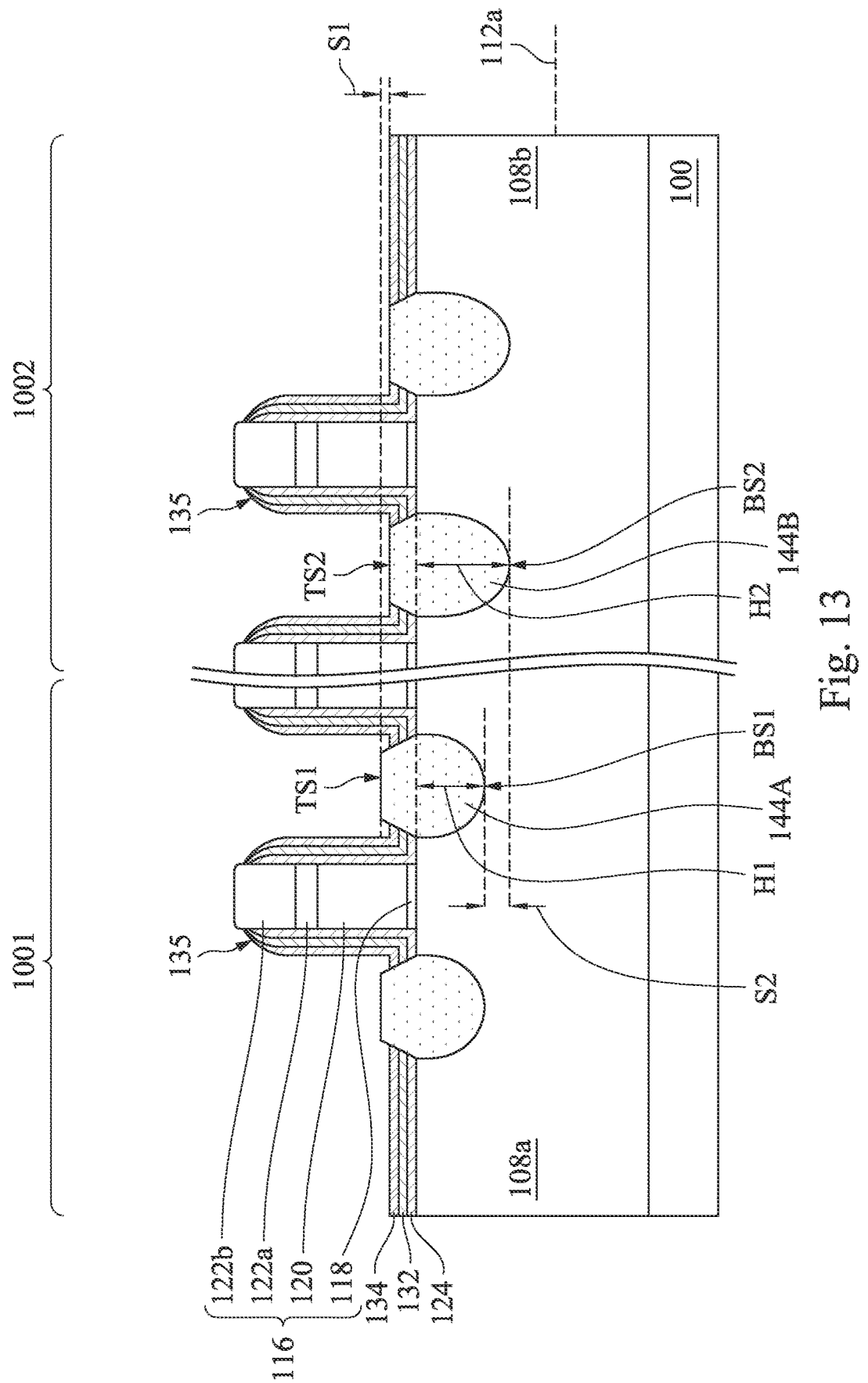

Reference is made to FIG. 13. First epitaxy structures 144A and second epitaxy structures 144B are respectively grown in the first recess 142A and the second recess 142B in the fins 108 (see FIG. 12). The first epitaxy structures 144A have a bottom surface BS1 at a different height than a bottom surface BS2 of the second epitaxy structures 144B. For example, the bottom surface BS1 of the first epitaxy structures 144A are spaced apart from the bottom surface BS2 of the second epitaxy structures 144B by a non-zero vertical spacing S2. The first epitaxy structures 144A are shallower than the second epitaxy structures 144B. In other words, the second epitaxy structures 144B are deeper than the first epitaxy structures 144A.

The first epitaxy structures 144A and the second epitaxy structures 144B may have facets. In some embodiments, the first epitaxy structures 144A have a height H1 measured from a top surface of the fin 108 to a bottom surface of the first epitaxy structures 144A. In some embodiments, the second epitaxy structures 144B has a height H2 measured from the top surface of the fin 108 to a bottom surface of the second epitaxy structures 144B. The height H2 is greater than the height H1. In this case, the first epitaxy structures 144A raise above the first recess 144A, and the second epitaxy structures 144B raise above the second recess 144B. Due to the difference between the depths D1 and D2, the first epitaxy structures 144A have a top surface TS1 higher than a top surface TS2 of the second epitaxy structures 144B. For example, the top surface TS1 of the first epitaxy structures 144A and the top surface TS2 of the second epitaxy structures 144B are spaced apart by a non-zero vertical spacing S1. The first and second epitaxy structures 144A and 144B may be co-planar with the top surface of fin 108 in some other embodiments.

In some embodiments, the first epitaxy structures 144A and the second epitaxy structures 144B may exert stress on the fins 108, thereby improving device performance. In some embodiments, the first epitaxy structures 144A and the second epitaxy structures 144B may include any acceptable material appropriate for n-type FinFETs. For example, if the fins 108 are silicon, the first epitaxy structures 144A and the second epitaxy structures 144B may include materials exerting a tensile strain on the fins 108, such as silicon carbide, phosphorous doped silicon carbide, silicon phosphide, or the like. In some embodiments, the first epitaxy structures 144A and the second epitaxy structures 144B may include any acceptable material appropriate for p-type FinFETs. For example, if the fins 108 are silicon, the first epitaxy structures 144A and the second epitaxy structures 144B may include materials exerting a compressive strain on the fins

108, such as silicon germanium, boron doped silicon germanium, germanium, germanium tin, or the like.

The first epitaxy structures 144A and the second epitaxy structures 144B may be implanted with dopants to form source/drain regions, followed by an anneal. The n-type and/or p-type impurities for source/drain regions may be any of the impurities previously discussed. In some embodiments, the first epitaxy structures 144A and the second epitaxy structures 144B may be in situ doped during growth.

Figure 14:
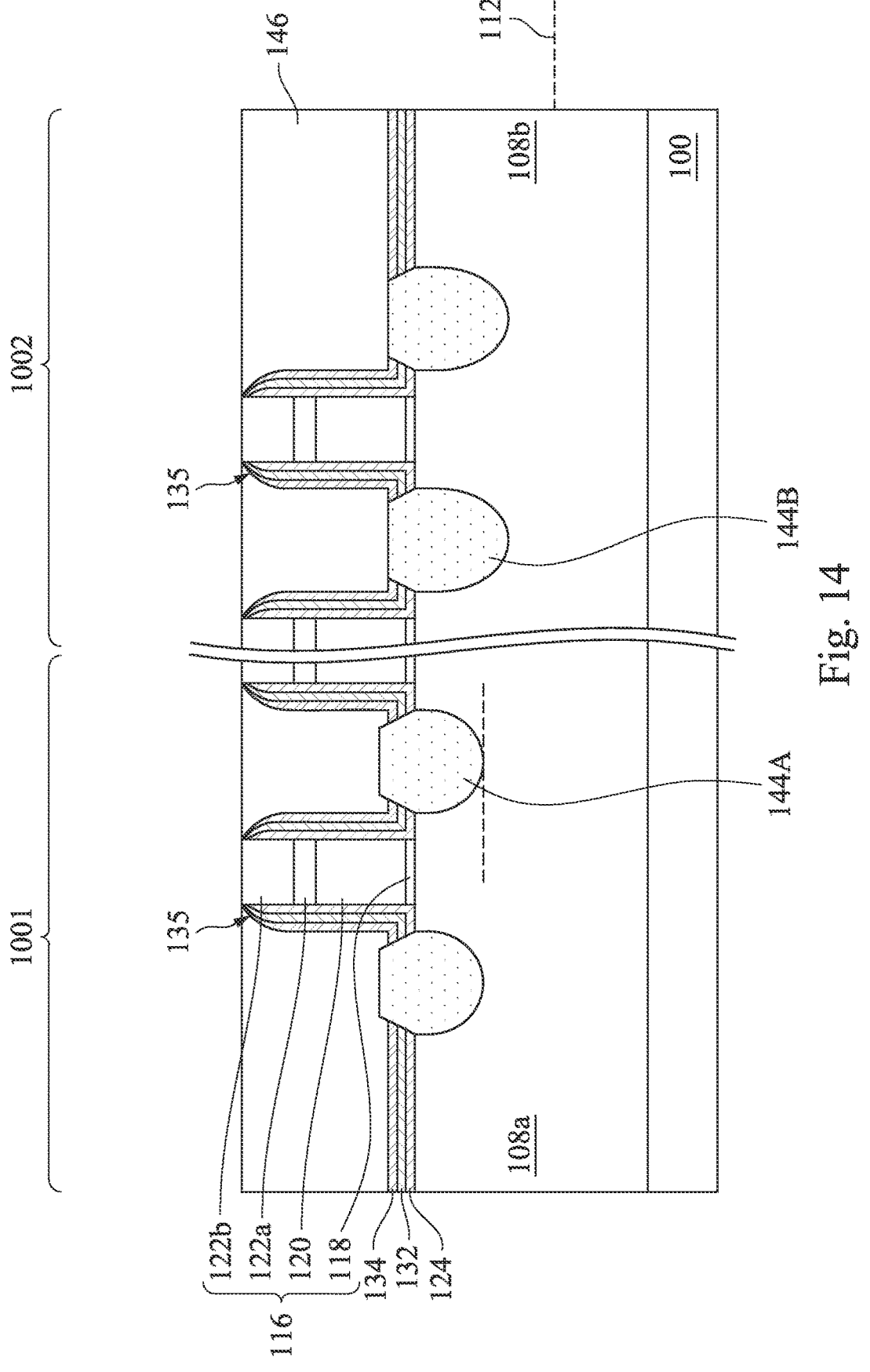

In FIG. 14, an inter-layer dielectric (ILD) layer 146 is formed. In accordance with some embodiments of the present disclosure, a buffer oxide layer (not shown) and a Contact Etch Stop Layer (CESL) are formed on the first and second epitaxial source/drain regions 144A and 144B before the formation of the ILD layer 146. The buffer oxide layer may be formed of silicon oxide, and the CESL may be formed of silicon nitride, silicon carbo-nitride, or the like. The buffer oxide layer and the CESL may be formed using a conformal deposition method such as ALD, for example. The ILD layer 146 may include a dielectric material formed using, for example, FCVD, spin-on coating, CVD, or other deposition methods. The ILD layer 146 may also be formed of Tetra Ethyl Ortho Silicate (TEOS) oxide, Plasma Enhanced CVD (PECVD) oxide (SiO2), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of the ILD layer 146, the dummy gate stacks 116, the first spacer layer 124, the second spacer layer 132, and the third spacer layer 134 with each other.

Figure 15:
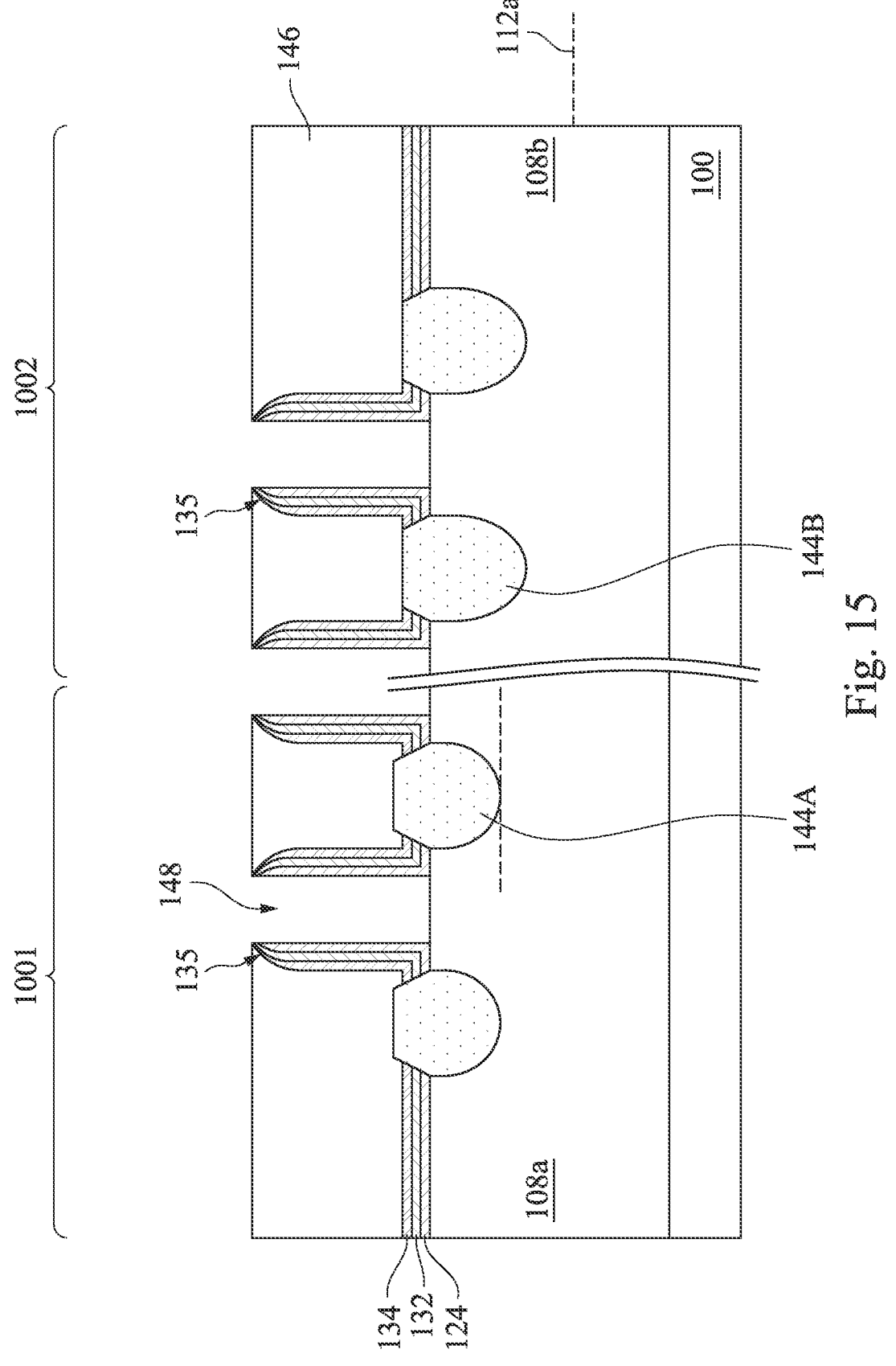
Figure 16:
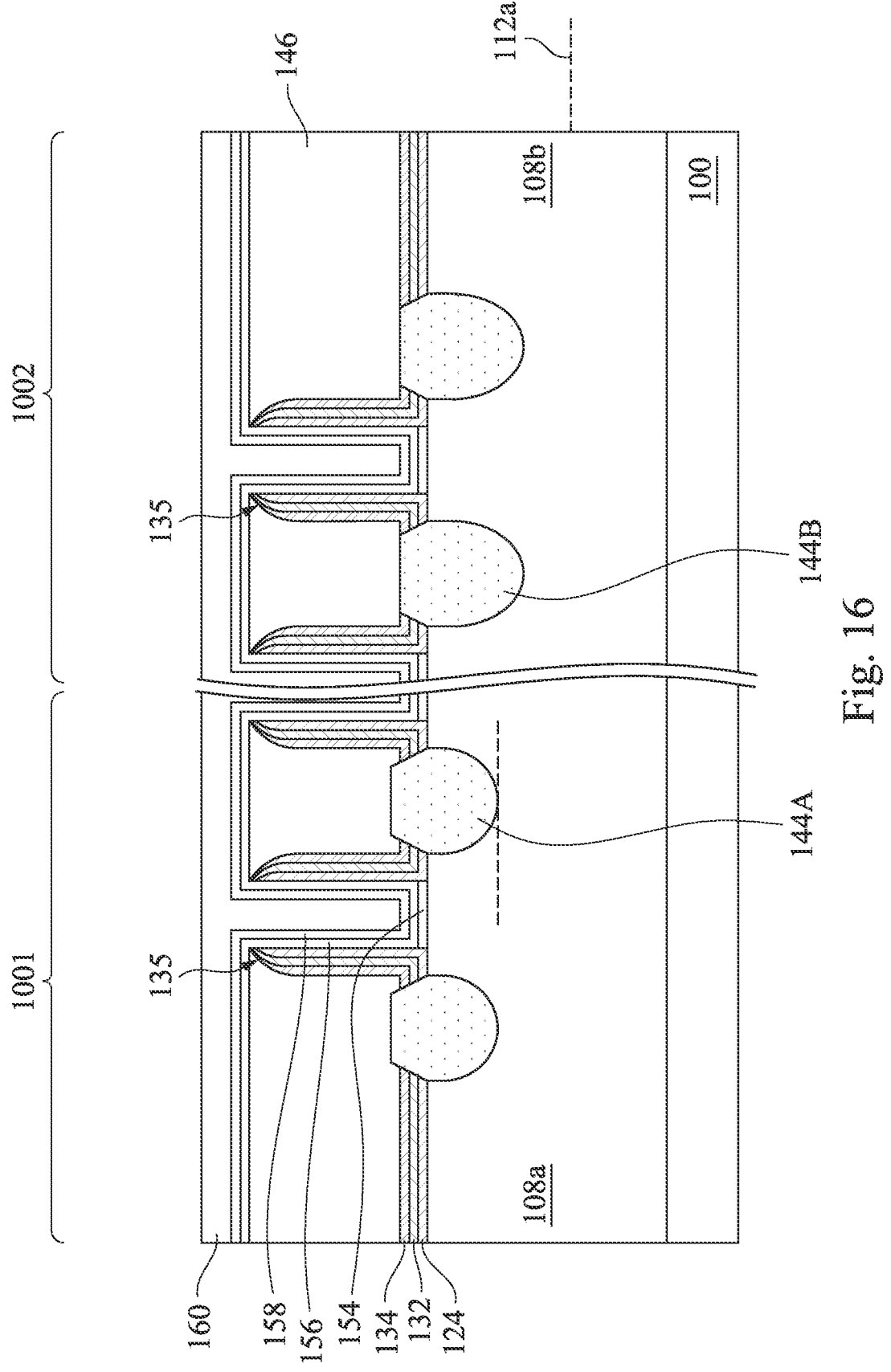

Next, the dummy gate stacks 116, which include the hard mask layers 122a and 122b, the dummy gate electrode 120 and the dummy gate dielectric 118 are replaced with replacement gate stacks, which include replacement gates and replacement gate dielectrics as shown in FIGS. 15 and 16.

When replacing the dummy gate stacks 116, the hard mask layers 122a and 122b, the dummy gate electrode 120, and the dummy gate dielectric 118 as shown in FIG. 14 are first removed in one or a plurality of etching steps, resulting in trenches 148 as shown in FIG. 15. The protruding fins 108 are exposed to trenches 148.

Next, referring to FIG. 16, a gate dielectric layer is formed, which extend into the trenches 148 (FIG. 15). In accordance with some embodiments of the present disclosure, the gate dielectric layer includes an Interfacial Layer (IL) 154 as its lower part. The IL 154 is formed on the exposed surfaces of protruding fins 108. The IL 154 may include an oxide layer such as a silicon oxide layer, which is formed through the thermal oxidation of the protruding fins 108, a chemical oxidation process, or a deposition process. The gate dielectric layer may also include a high-k dielectric layer 156 formed over the IL 154. The high-k dielectric layer 156 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. The high-k dielectric layer 156 is overlying, and may contact, the IL 154. The high-k dielectric layer 156 is formed as a conformal layer, and extends on the protruding fins 108 and the top surface and the sidewalls of the gate spacers 135. In accordance with some embodiments of the present disclosure, the high-k dielectric layer 156 is formed using ALD or CVD.

Referring further to FIG. 16, stacked layers 158 are deposited. Sub-layers in the stacked layers 58 are not shown separately, while in reality, the sub-layers are distinguishable from each other. The deposition may be performed using a conformal deposition method such as ALD or CVD. The stacked layers 158 extend into the trenches 148 (FIG. 15), and include some portions over the ILD layer 146.

The stacked layers 158 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The specific material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), another barrier layer, which may be another TiN layer, is formed.

Figure 17:
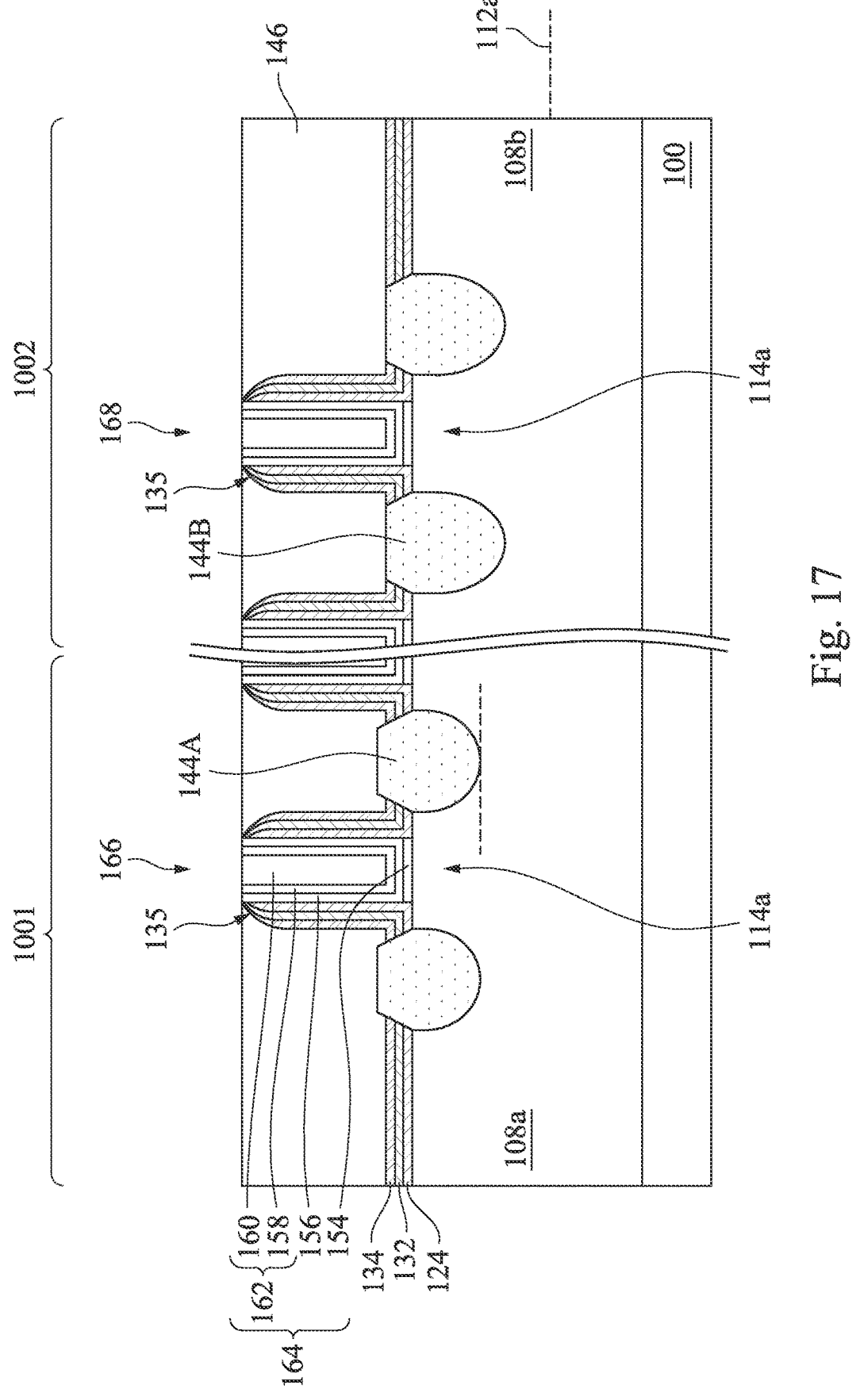

Next, a metallic material 160 is deposited, which may be formed of cobalt (Co), or tungsten (W), for example. The metallic material 160 fully fills the remaining trenches 148 (see FIG. 15). In a subsequent step as shown in FIG. 17, a planarization step such as CMP or mechanical grinding is performed, so that the portions of high-k dielectric layer 156, stacked layers 158, and the metallic material 160 over the ILD layer 146 are removed. As a result, metal gate electrodes 162 are formed, which include the remaining portions of the stacked layers 158, and the metallic material 160. The remaining portions of the high-k dielectric layer 156, the stacked layers 158, and the metallic material 160 are referred to as replacement gate stacks 164 hereinafter. As shown in FIG. 17, top surfaces of the metal gate electrodes 162, the gate spacers 135, and the ILD layer 146 may be substantially coplanar at this time. The ILD layer 146 laterally surrounds the replacement gate stacks 164.

The resulting semiconductor device 10 including a Static Random Access Memory (SRAM) device 166 in the first device region 1001 and a logic device 168 in the second device region 1002. As compared to the second epitaxy structures 144B, a junction depth of the first epitaxy structures 144A and the corresponding channel region 114a is unchanged, and thus can suppressing the short channel effect (SCE), such as drain induced barrier lowering (DIBL), subthreshold swing variation and stuck-open fault (SOF) of the SRAM device 166. In the logic device 168, due to the deeper junction of the second epitaxy structures 144B and the corresponding channel region 114a, the channel resistance of the channel region 114a in the second device region 1002 can be reduced, and the decay of the ac signal along the channel of the logic device 168 can be eliminated.

Figure 18:
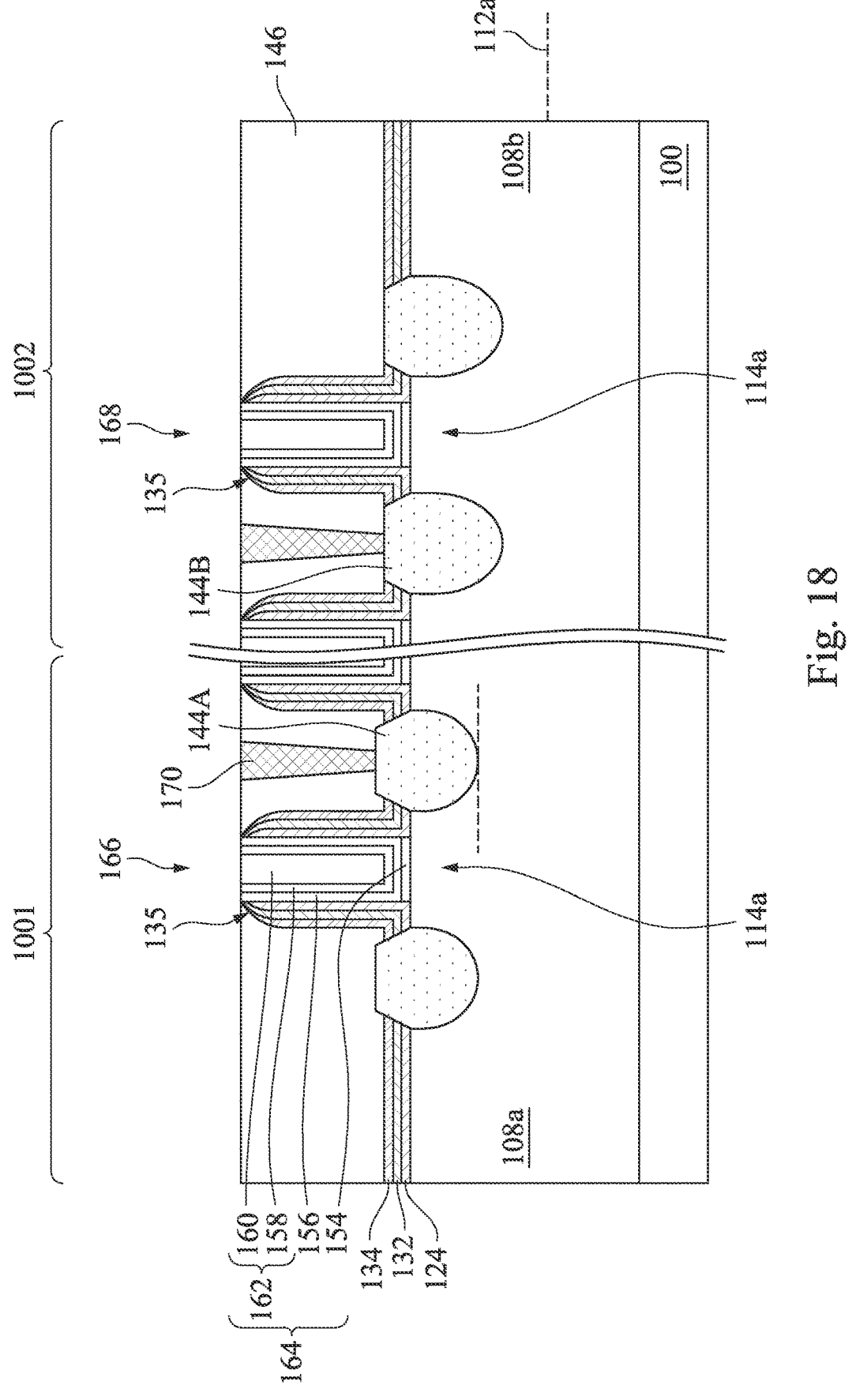

Referring to FIG. 18, contacts 170 are formed by forming a contact trench in the ILD layer 146 over the first and second epitaxial source/drain regions 144A and 144B and filling the contact trench by a conductive material. In some embodiments, the conductive material used to make contact 170 includes aluminum (Al), copper (Cu), tungsten (W), titanium (Ti), tantulum (Ta), titanium nitride (TiN), tantalum nitride (TaN), nickel silicide (NiS), cobalt silicide (CoSi), tantulum carbide (TaC), tantulum silicide nitride (TaSiN), tantalum carbide nitride (TaCN), titanium aluminide (TiAl), titanium aluminide nitride (TiAlN), other applicable conductive materials, or a combination thereof. In some embodiments, contacts 170 include a titanium nitride layer and tungsten formed over the titanium nitride layer.

In addition, contact 170 may further include a liner and/or a barrier layer. For example, a liner (not shown) may be formed on the sidewalls and bottom of the contact trench. The liner may be either tetraethylorthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

Although not specifically illustrated, It is understood that the semiconductor device 10 shown in FIG. 18 undergoes further complementary metal oxide semiconductor (CMOS) processes to form various features such as interconnect metal layers, dielectric layers, passivation layers, etc.

Figure 19:
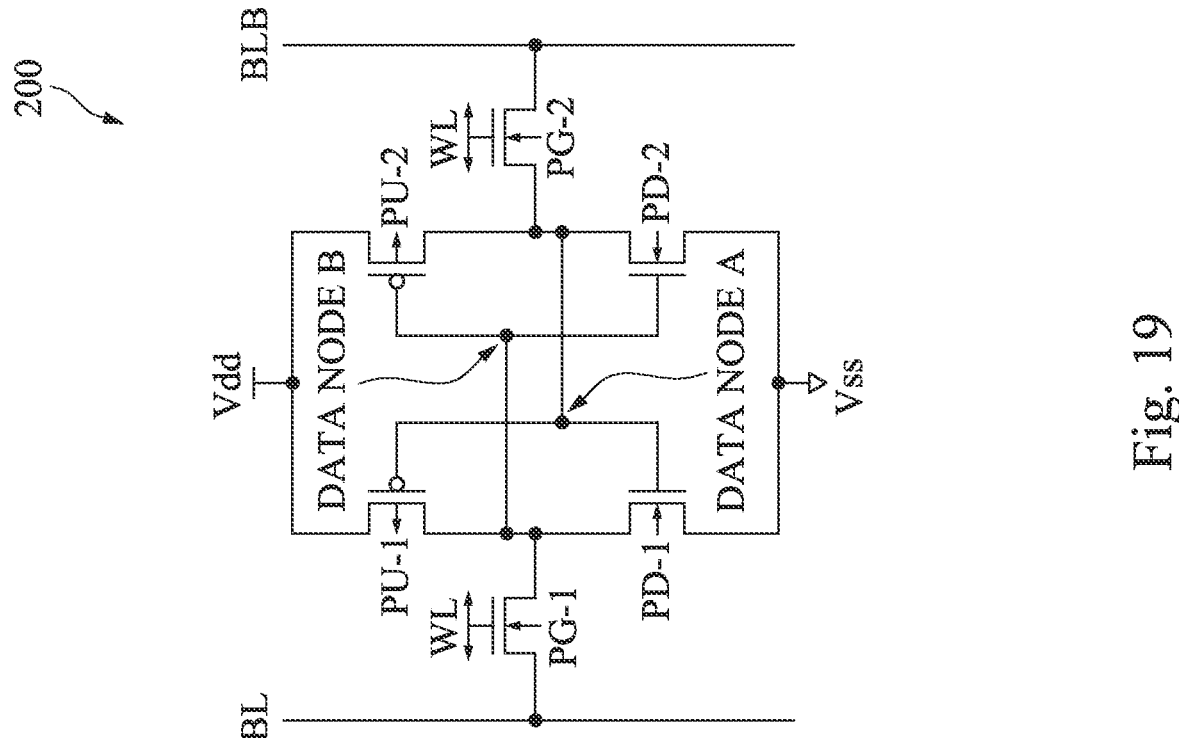
FIG. 19 illustrates a circuit diagram of a Static Random Access Memory (SRAM) cell in accordance with exemplary embodiments.

FIG. 19 illustrates a circuit diagram of a SRAM cell 200 in accordance with some embodiments. The SRAM cell 200 includes pass-gate transistors PG-1 and PG-2 and pull-down transistors PD-1 and PD-2, which are N-type Metal-Oxide-Semiconductor (NMOS) transistors. The SRAM cell 200 further includes pull-up transistors PU-1 and PU-2, which are P-type Metal-Oxide-Semiconductor (PMOS) transistors, The gates of pass-gate transistors PG-1 and PG-2 are connected to word-line WL that determines whether SRAM cell 200 is selected or not. A latch formed of pull-up transistors PU-1 and PU-2 and pull-down transistors PD-1 and PD-2 stores a bit, wherein the complementary values of the bit are stored in data node A and data node B. The stored bit can be written into, or read from, SRAM cell 200 through bit lines BL and BLB.

The sources of pull-up transistors PU-1 and PU-2 are connected to voltage node Vdd, which carries positive power supply voltage (and line) Vdd. The sources of pull-down transistors PD-1 and PD-2 are connected to power supply node Vss, which are further connected to power supply voltage/line Vss (an electrical ground, for example). The gates of transistors PU-1 and PD-1 are connected to the drains of transistors PU-2 and PD-2, which connection node is data node A. The gates of transistors PU-2 and PD-2 are connected to the drains of transistors PU-1 and PD-1, which connection node is data node B. A source or drain region (referred to as source/drain region hereinafter) of pass-gate transistor PG-1 is connected to bit-line BL. A source/drain region of pass-gate transistor PG-2 is connected to bit-line BLB.

In some embodiments, transistors PD-1 and PD-2 and/or transistors PG-1 and PG-2 are formed using essentially the same process as for forming the SRAM device 166 in first device region 1001 (FIG. 18). Transistors PD-1 and PD-2 and/or transistors PG-1 and PG-2 thus have a shallow epitaxy source/drain regions. With the shallow epitaxy source/drain regions, the short channel effect (SCE) of transistors PD-1 and PD-2 and/or transistors PG-1 and PG-2 can be suppressed. With the suppressed SCE, the states of the SRAM cell 200 can have improved stability. On the other hand, in the same chip and on the same substrate 100, the logic device 168 (FIG. 18) is also formed. The transistor, with the deeper epitaxy source/drain regions, has a reduced channel resistance and eliminated decay of the ac signal along the channel, and can be used as, for example, a logic device for the SRAM cell 200 due to its higher performance. Hence, the present disclosure provides a multi-device characteristics solution for forming transistors having different device characteristics to suit to different requirements.

Figure 20:
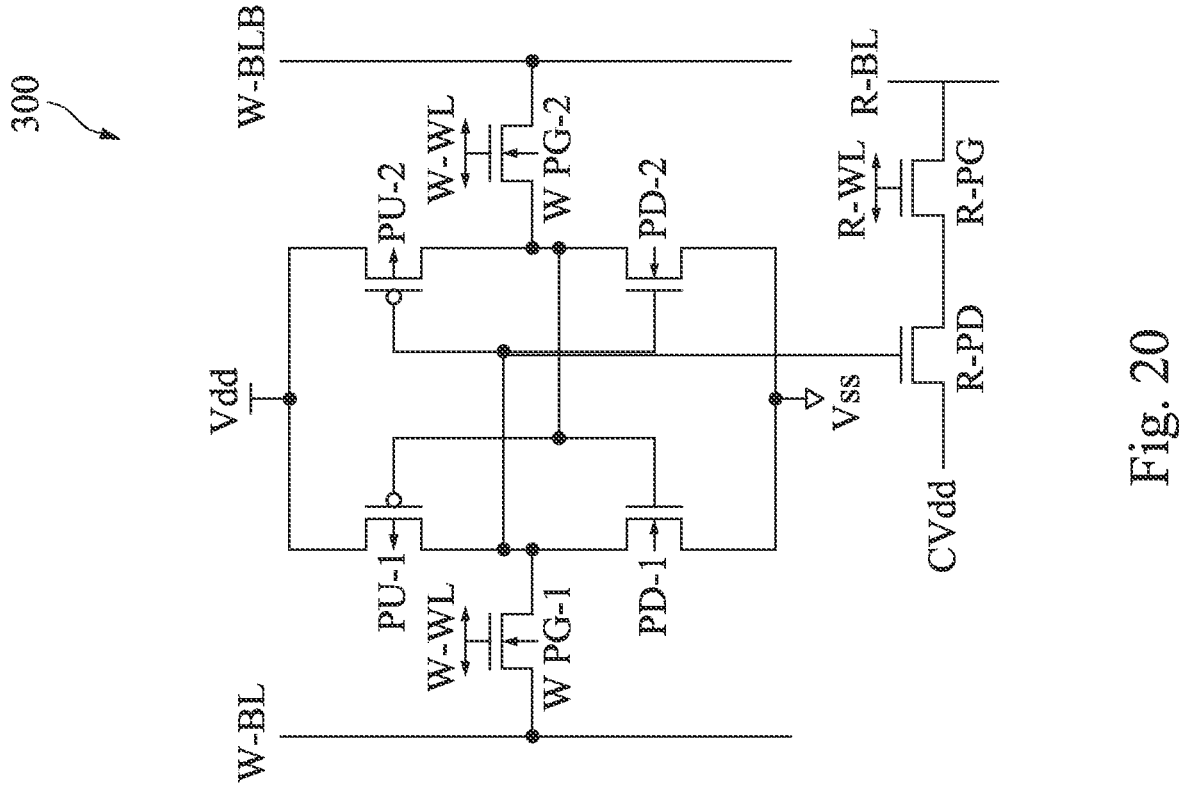
FIG. 20 is a circuit diagram of a two-port SRAM cell in accordance with exemplary embodiments.

FIG. 20 illustrates a circuit diagram of two-port SRAM cell 300, which includes a write port and a read port. The write port includes transistors PU-1 and PD-1, and transistors PU-2 and PD-2. The write port further includes pass-gate transistors W_PG-1 and W_PG-2, wherein the gates of transistors W_PG-1 and W_PG-2 are coupled to write word-line W-WL. The writing of SRAM cell 300 is through complementary write bit-lines W-BL and W-BLB. The read port includes transistors PU-1 and PD-1, transistors PU-2 and PD-2, pull-down transistor R-PD, and pass-gate transistor R-PG. The data retrieved from SRAM cell 300 is sent to read bit-line R-BL. Transistors R-PD is further coupled to positive power supply CVdd. Transistors R-PD and R-PG are cascaded. The gate of transistor RPG may be coupled to read word-line R-WL.

In some embodiments, transistors PD-1 and PD-2 (and possibly W_PG-1 and W_PG-2) are formed in first device region 1001 (FIG. 18) and having the structures of the SRAM device 166. Therefore, they have suppressed short channel effect (SCE), and hence the SRAM cell 300 is highly stable. Transistors R-PD and RPG, on the other hand, do not have the stability concern. Hence, they are formed in second device region 1002 (FIG. 18) and have the structures of the logic device 168, so that they can have reduced channel resistance and eliminated decay of the ac signal along the channel. The read speed of the read port is hence improved without sacrificing the stability of SRAM cell 300. Therefore, the present disclosure provides a solution of incorporating devices with multi-device characteristics in a same SRAM cell without increasing the manufacturing cost.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by performing an implantation process to reduce an etch resistance of the source/drain regions of the fins, subsequent recesses with depths that varied among the first device region and the second device region in later processing can be formed. Another advantage is that subsequent epitaxy structures formed in the recesses can have varied depth, in which the a junction depth of the first epitaxy structures and the corresponding channel region is unchanged, and thus can suppressing the short channel effect (SCE), such as drain induced barrier lowering (DIBL), subthreshold swing variation and stuck-open fault (SOF) of the SRAM device. Yet another advantage is that in the logic device, due to the deeper junction of the second epitaxy structures and the corresponding channel region, the channel resistance of the channel region in the second device region can be reduced, and the decay of the ac signal along the channel of the logic device can be eliminated.

In some embodiments, a method of forming a semiconductor device includes forming a first fin structure and a second fin structure on a substrate, forming a first gate stack and a second gate stack crossing the first fin structure and the second fin structure, respectively, wherein the first fin structure has a first channel region under the first gate stack and a first source/drain region adjacent to the first channel region, and the second fin structure has a second channel region under the second gate stack and a second source/drain region adjacent to the second channel region, performing an ion implantation process to introduce impurities into the second source/drain region to form an implanted region in the second source/drain region, performing an etching process to form a first recess in the first source/drain region and a second recess in the second source/drain region, wherein the second recess penetrates through the implanted region, and forming epitaxy structures in the first recess and the second recess, respectively. In some embodiments, the impurities include nitrogen. In some embodiments, the method further includes prior to performing the ion implantation process, forming a hard mask on the first gate stack and the second gate stack, and patterning the hard mask using a photoresist to expose the second gate stack. In some embodiments, the second recess is deeper than the first recess. In some embodiments, the method further includes prior to performing the ion implantation process, forming a first spacer layer extending along the first gate stack, the second gate stack, the first fin structure and the second fin structure. In some embodiments, the method further includes after performing the ion implantation process, forming a second spacer layer on the first spacer layer. In some embodiments, the method further includes forming a third spacer layer on the second spacer layer, wherein the third spacer layer has a composition different from a composition of the second spacer layer. In some embodiments, the etching process is performed such that the first spacer layer, the second spacer layer and the third spacer layer are etched to form gate spacers laterally surrounding the first gate stack and the second gate stack. In some embodiments, the ion implantation process is performed after forming the first gate stack and the second gate stack.

In some embodiments, a method of forming a semiconductor device includes forming a first fin structure and a second fin structure on a substrate, forming a first gate stack and a second gate stack crossing the first fin structure and the second fin structure, respectively, wherein the first fin structure has a first channel region under the first gate stack and a first source/drain region adjacent to the first channel region, and the second fin structure has a second channel region under the second gate stack and a second source/drain region adjacent to the second channel region, and forming a first epitaxy structure embedded in the first source/drain region and a second epitaxy structure embedded in the second source/drain region, wherein the first epitaxy structure has a bottom surface higher than a bottom surface of the second epitaxy structure. In some embodiments, the first epitaxy structure has a top surface higher than a top surface of the second epitaxy structure. In some embodiments, the method further includes prior to forming the first epitaxy structure and the second epitaxy structure, recessing the first source/drain region and the second source/drain region. In some embodiments, the method further includes prior to recessing the first source/drain region and the second source/drain region, introducing nitrogen atoms into the second source/drain region. In some embodiments, the nitrogen atoms in the second source/drain region are partially removed during recessing the second source/drain region.

In some embodiments, a semiconductor device includes a first fin structure protruding from a substrate, a second fin structure protruding from the substrate, a first gate stack crossing the first fin structure, a second gate stack crossing the second fin structure and parallel to the first gate stack, a first source/drain region on one side of the first gate stack, and a second source/drain region on one side of the second gate stack. The second source/drain region has a bottom surface at a different height than a bottom surface of the first source/drain region. In some embodiments, the bottom surface of the second source/drain region is lower than the bottom surface of the first source/drain region. In some embodiments, the semiconductor device further includes multi-layer gate spacers on sidewalls of the first gate stack. In some embodiments, the multi-layer gate spacers each include a first spacer layer and a second spacer layer on the first spacer layer. The first spacer layer has a nitrogen concentration greater than a nitrogen concentration of the second spacer layer. In some embodiments, the first spacer layer has an oxygen concentration lower than an oxygen concentration of the second spacer layer. In some embodiments, the multi-layer gate spacers each further include a third spacer layer on the second spacer layer, where the third spacer layer is silicon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a first fin structure and a second fin structure on a substrate;
   forming a first gate stack and a second gate stack crossing the first fin structure and the second fin structure, respectively, wherein the first fin structure has a first channel region under the first gate stack and a first source/drain region adjacent to the first channel region, and the second fin structure has a second channel region under the second gate stack and a second source/drain region adjacent to the second channel region;
   performing an ion implantation process to introduce impurities into the second source/drain region to form an implanted region in the second source/drain region;
   performing an etching process to form a first recess in the first source/drain region and a second recess in the second source/drain region, wherein the second recess penetrates through the implanted region;
   forming epitaxy structures in the first recess and the second recess, respectively;
   prior to performing the ion implantation process, forming a first spacer layer extending along the first gate stack, the second gate stack, the first fin structure and the second fin structure; and
   after performing the ion implantation process, forming a second spacer layer on the first spacer layer.

2. The method of claim 1, wherein the impurities include nitrogen.

3. The method of claim 1, further comprising:
   prior to performing the ion implantation process, forming a hard mask on the first gate stack and the second gate stack; and
   patterning the hard mask using a photoresist to expose the second gate stack.

4. The method of claim 1, wherein the second recess is deeper than the first recess.

5. The method of claim 1, further comprising:
   forming a third spacer layer on the second spacer layer, wherein the third spacer layer has a composition different from a composition of the second spacer layer.

6. The method of claim 5, wherein the etching process is performed such that the first spacer layer, the second spacer layer and the third spacer layer are etched to form gate spacers laterally surrounding the first gate stack and the second gate stack.

7. The method of claim 1, wherein the ion implantation process is performed after forming the first gate stack and the second gate stack.

8. A method of forming a semiconductor device, comprising:
   forming a first fin structure protruding from a substrate;
   forming a second fin structure protruding from the substrate;
   forming a first gate stack crossing the first fin structure;
   forming a second gate stack crossing the second fin structure and parallel to the first gate stack, wherein the first fin structure has a first channel region under the first gate stack and a first source/drain region adjacent to the first channel region, and the second fin structure has a second channel region under the second gate stack and a second source/drain region adjacent to the second channel region;
   performing an ion implantation process to introduce impurities into the second source/drain region to form an implanted region in the second source/drain region such that the second source/drain region has a bottom surface at a different height than a bottom surface of the first source/drain region;
   prior to performing the ion implantation process, forming a first spacer layer extending along the first gate stack, the second gate stack, the first fin structure and the second fin structure; and
   after performing the ion implantation process, forming a second spacer layer on the first spacer layer.

9. The method of claim 8, wherein the bottom surface of the second source/drain region is lower than the bottom surface of the first source/drain region.

10. The method of claim 8, wherein the first spacer layer has a nitrogen concentration greater than a nitrogen concentration of the second spacer layer.

11. The method of claim 10, wherein the first spacer layer has an oxygen concentration lower than an oxygen concentration of the second spacer layer.

12. The method of claim 10, further comprising:
   forming a third spacer layer on the second spacer layer, where the third spacer layer is silicon nitride.

13. A method of forming a semiconductor device, comprising:
   forming a first fin structure and a second fin structure on a substrate;
   forming a first gate stack and a second gate stack crossing the first fin structure and the second fin structure, respectively, wherein the first fin structure has a first channel region under the first gate stack and a first source/drain region adjacent to the first channel region, and the second fin structure has a second channel region under the second gate stack and a second source/drain region adjacent to the second channel region;

US 12,641,811 B2

15 performing an ion implantation process to introduce impurities into the second source/drain region to form an implanted region in the second source/drain region;

forming a first epitaxy structure embedded in the first source/drain region and a second epitaxy structure embedded in the second source/drain region;

prior to forming the first epitaxy structure and the second epitaxy structure, recessing the first source/drain region and the second source/drain region; and prior to recessing the first source/drain region and the second source/drain region, wherein performing the ion implantation process to introduce the impurities into the second source/drain region comprises introducing nitrogen atoms into the second source/drain region.

14. The method of claim 13, wherein the first epitaxy structure has a top surface higher than a top surface of the second epitaxy structure.

15. The method of claim 13, wherein the nitrogen atoms in the second source/drain region are partially removed during recessing the second source/drain region.

16. The method of claim 13, wherein the first epitaxy structure has a bottom surface higher than a bottom surface of the second epitaxy structure.

17. The method of claim 13, wherein the impurities is not n-type dopants.

18. The method of claim 13, wherein the impurities is not p-type dopants.

19. The method of claim 13, further comprising:

forming a first contact over the first epitaxy structure and a second contact over the second epitaxy structure, wherein the first contact has a bottom surface higher than a bottom surface of the second contact.

20. The method of claim 19, wherein the first contact has a top surface level with a top surface of the second contact.

* * * * *